(12) United States Patent
Ogihara et al.

(10) Patent No.: US 7,871,834 B2
(45) Date of Patent: Jan. 18, 2011

(54) COMBINED SEMICONDUCTOR APPARATUS WITH THIN SEMICONDUCTOR FILMS

(75) Inventors: Mitsuhiko Ogihara, Tokyo (JP); Hiroyuki Fujiwara, Tokyo (JP); Ichimatsu Abiko, Tokyo (JP); Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 1 day.

(21) Appl. No.: 12/320,511

(22) Filed: Jan. 28, 2009

(65) Prior Publication Data
US 2009/0149000 A1 Jun. 11, 2009

Related U.S. Application Data

(62) Division of application No. 11/806,145, filed on May 30, 2007, now abandoned, which is a division of application No. 10/705,895, filed on Nov. 13, 2003, now Pat. No. 7,239,337.

(30) Foreign Application Priority Data
Nov. 13, 2002 (JP) ............... 2002-329273

(51) Int. Cl.
*H01L 21/50* (2006.01)
(52) U.S. Cl. ............... 438/23; 438/107; 438/455; 257/E21.122
(58) Field of Classification Search ............... 438/23, 438/107, 455
See application file for complete search history.

(56) References Cited

U.S. PATENT DOCUMENTS

| | | | |
|---|---|---|---|
| 4,936,808 A | 6/1990 | Lee et al. | |
| 5,485,021 A | 1/1996 | Abe et al. | |
| 5,593,917 A * | 1/1997 | Nuyen | ............... 438/28 |
| 5,681,756 A | 10/1997 | Norman et al. | |
| 5,689,136 A | 11/1997 | Usami et al. | |
| 5,714,782 A | 2/1998 | Nakagawa et al. | |
| 5,793,405 A | 8/1998 | Shakuda et al. | |
| 5,963,287 A | 10/1999 | Asada et al. | |

(Continued)

FOREIGN PATENT DOCUMENTS

| | | |
|---|---|---|
| CN | 1159786 | 9/1997 |
| CN | 1216833 | 5/1999 |
| EP | 1104937 | 6/2001 |
| JP | 08111360 | 4/1996 |
| JP | 10063807 | 3/1998 |

(Continued)

OTHER PUBLICATIONS

Yablonovitch et al, "Van der Waals bonding of GaAS on Pd leads to a permanent, solid-phase-topotaxial, metallurgical bond," Appl. Phys. Lett. 59 (24), pp. 3159-3161, Dec. 9, 1991.

*Primary Examiner*—Savitri Mulpuri
(74) *Attorney, Agent, or Firm*—Rabin & Berdo, P.C.

(57) ABSTRACT

A semiconductor apparatus includes two thin semiconductor films bonded to a substrate, and a thin-film interconnecting line electrically connecting a semiconductor device such as a light-emitting device in the first thin semiconductor film to an integrated circuit in the second thin semiconductor film. Typically, the integrated circuit drives the semiconductor device. The two thin semiconductor films are formed separately from the substrate. The first thin semiconductor film may include an array of semiconductor devices. The first and second thin semiconductor films may be replicated as arrays bonded to the same substrate. Compared with conventional semiconductor apparatus comprising an array chip and a separate driver chip, the invented apparatus is smaller and has a reduced material cost.

1 Claim, 28 Drawing Sheets

U.S. PATENT DOCUMENTS

| | | |
|---|---|---|
| 6,242,358 B1 | 6/2001 | Chu et al. |
| 6,633,322 B2 | 10/2003 | Sakai et al. |
| 6,790,695 B2 * | 9/2004 | Ogihara et al. ............... 438/33 |
| 6,825,867 B2 | 11/2004 | Koga et al. |
| 7,239,337 B2 | 7/2007 | Ogihara et al. |
| 2002/0070382 A1 | 6/2002 | Yamazaki et al. |
| 2004/0014299 A1 * | 1/2004 | Moriceau et al. ............ 438/459 |
| 2004/0089939 A1 | 5/2004 | Ogihara et al. |

FOREIGN PATENT DOCUMENTS

| | | |
|---|---|---|
| JP | 2001-068795 | 3/2001 |
| JP | 2002-083953 | 3/2002 |
| JP | 2002-326384 | 11/2002 |

* cited by examiner

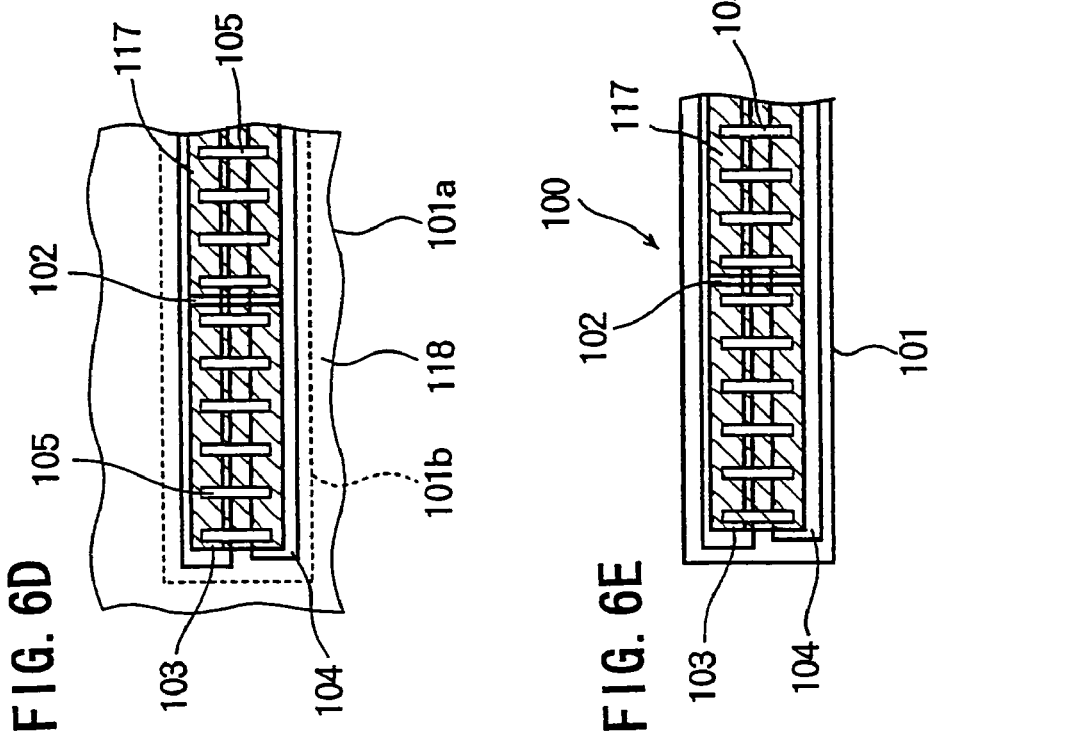
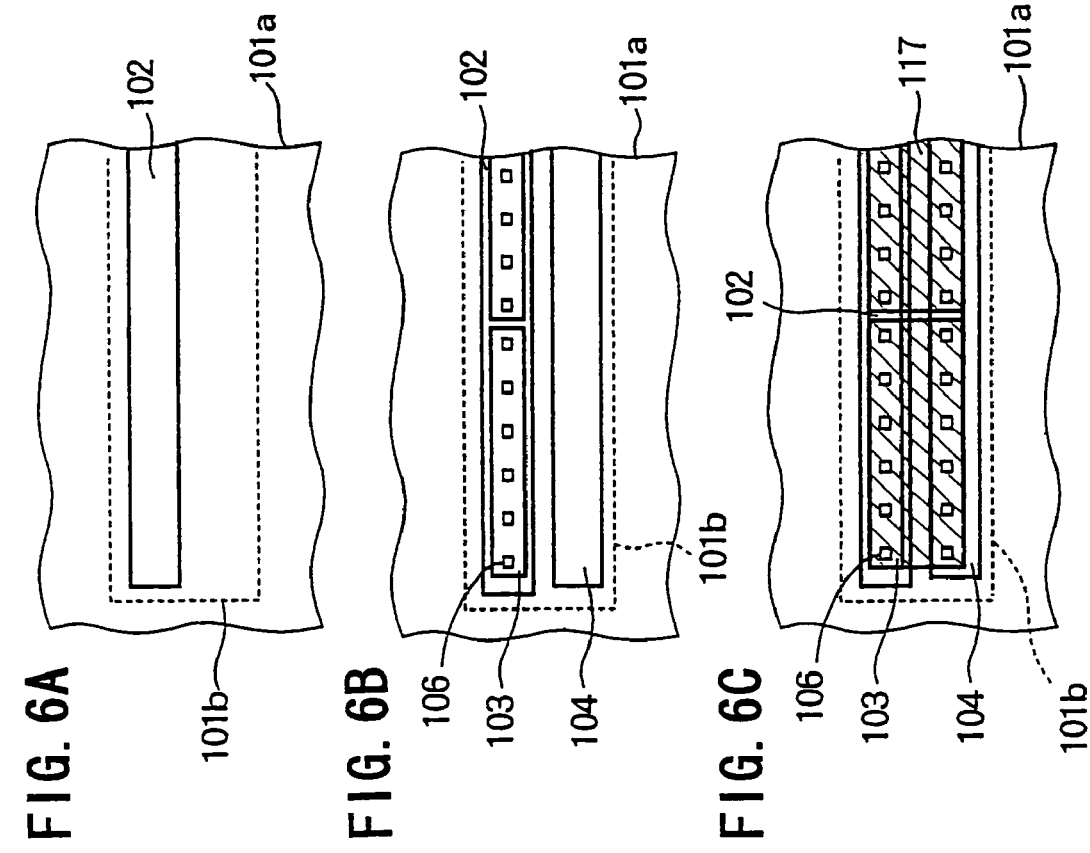

COMBINED SEMICONDUCTOR APPARATUS WITH THIN SEMICONDUCTOR FILMS

CROSS-REFERENCE TO RELATED APPLICATIONS

This is a division of U.S. application Ser. No. 11/806,145, filed on May 30, 2007, now abandoned which itself was a division of U.S. application Ser. No. 10/705,895, filed on Nov. 13, 2003 (now U.S. Pat. No. 7,239,337, issued Jul. 3, 2007). Furthermore, this application claims the benefit of Japanese application 2002-329273, filed on Nov. 13, 2002. The disclosures of these prior US and Japanese applications are incorporated herein by reference.

BACKGROUND OF THE INVENTION

1. Field of the Invention

The present invention relates to a semiconductor apparatus useful in, for example, a light-emitting diode (LED) print head in an electrophotographic printer.

2. Description of the Related Art

Referring to FIG. 28, a conventional LED print head 900 includes a circuit board 901 on which are mounted a plurality of LED array chips 902 having electrode pads 903, and a plurality of driving integrated circuit (IC) chips 904 having electrode pads 905. The electrode pads 903, 905 are interconnected by bonding wires 906 through which current is supplied from the driving IC chips 904 to LEDs 907 formed in the LED array chips 902. Further electrode pads 909 on the driving IC chips 904 are connected to bonding pads 910 on the circuit board 901 by further bonding wires 911.

For reliable wire bonding, the electrode pads 903, 905, 909 must be comparatively large, e.g., one hundred micrometers square (100 µm×100 µm), and the LED array chips 902 must have approximately the same thickness as the driving IC chips 904 (typically 250-300 µm), even though the functional parts of the LED array chips 902 (the LEDs 907) have a depth of only about 5 µm from the surface. To accommodate the needs of wire bonding, an LED array chip 902 must therefore be much larger and thicker than necessary simply to accommodate the LEDs 907. These requirements drive up the size and material cost of the LED array chips 902.

As shown in plan view in FIG. 29, the electrode pads 903 may need to be arranged in a staggered formation on each LED array chip 902. This arrangement further increases the chip area and, by increasing the length of the path from some of the LEDs 907 to their electrode pads 903, increases the associated voltage drop.

The size of the driving IC chips 904 also has to be increased to accommodate the large number of bonding pads 905 by which they are interconnected to the LED array chips 902.

Light-emitting elements having a thin-film structure are disclosed in Japanese Patent Laid-Open Publication No. 10-063807 (FIGS. 3-6, FIG. 8, and paragraph 0021), but these light-emitting elements have electrode pads for solder bumps through which current is supplied. An array of such light-emitting elements would occupy substantially the same area as a conventional LED array chip 902.

SUMMARY OF THE INVENTION

A general object of the present invention is to reduce the size and material cost of semiconductor apparatus.

A more specific object is to reduce the size and material cost of a semiconductor apparatus comprising an array of light-emitting elements and their driving circuits.

The invention provides an integrated semiconductor apparatus in which a pair of thin semiconductor films are formed separately from, then bonded to, a substrate. The first thin semiconductor film includes at least one semiconductor device. The second thin semiconductor film includes an integrated circuit and a terminal to drive the semiconductor device in the first semiconductor film. An individual interconnecting line extends from the first thin semiconductor film to the second thin semiconductor film, partly crossing the substrate and electrically connecting the semiconductor device in the first thin semiconductor film to the terminal in the second thin semiconductor film. If necessary, a dielectric film may be provided to insulate the individual interconnecting line from parts of the thin semiconductor films and from the substrate.

The semiconductor device in the first thin semiconductor film may be an LED. The thin semiconductor film may include an array of LEDs which are driven by the integrated circuit in the second thin semiconductor film. Compared with conventional semiconductor apparatus comprising an LED array chip and a separate driving IC chip, the invented semiconductor apparatus has a reduced material cost because the LED array and integrated circuit are reduced to thin films and the overall size of the apparatus is reduced. The overall size is reduced because the large wire bonding pads conventionally used to interconnect the LEDs and their driving circuits are eliminated, and because the distance between the LEDs and their driving circuits can be reduced.

BRIEF DESCRIPTION OF THE DRAWINGS

In the attached drawings:

FIGS. 6A through 6E are plan views schematically showing steps in the fabrication process for the integrated LED/driving-IC chip in FIG. 1;

DETAILED DESCRIPTION OF THE INVENTION

Figure 1:
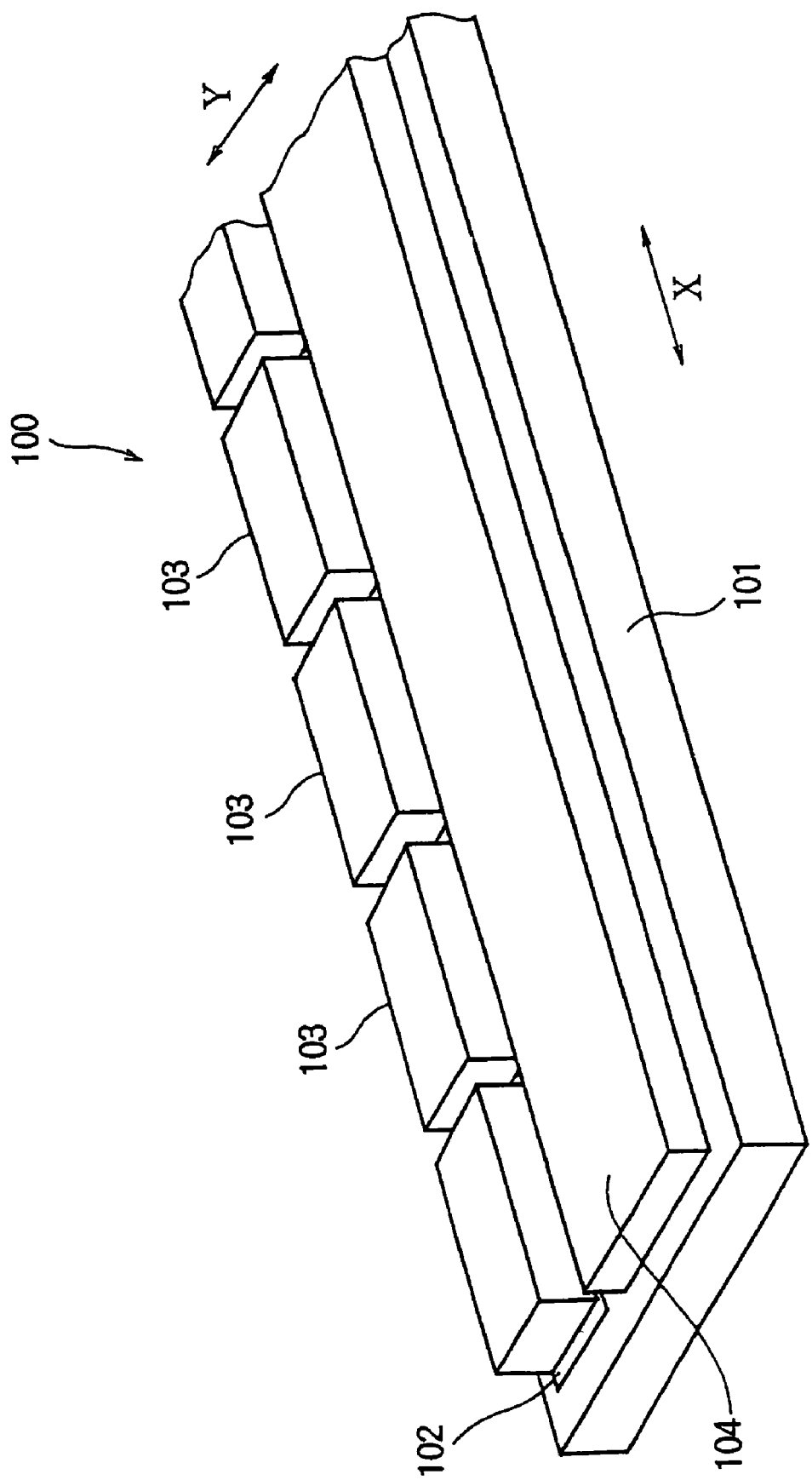
FIG. 1 is a perspective view schematically showing part of an integrated LED/driving-IC chip according to a first embodiment of the invention.

Embodiments of the invention will now be described with reference to the attached drawings, in which like elements are indicated by like reference characters.

First Embodiment

Figure 2:
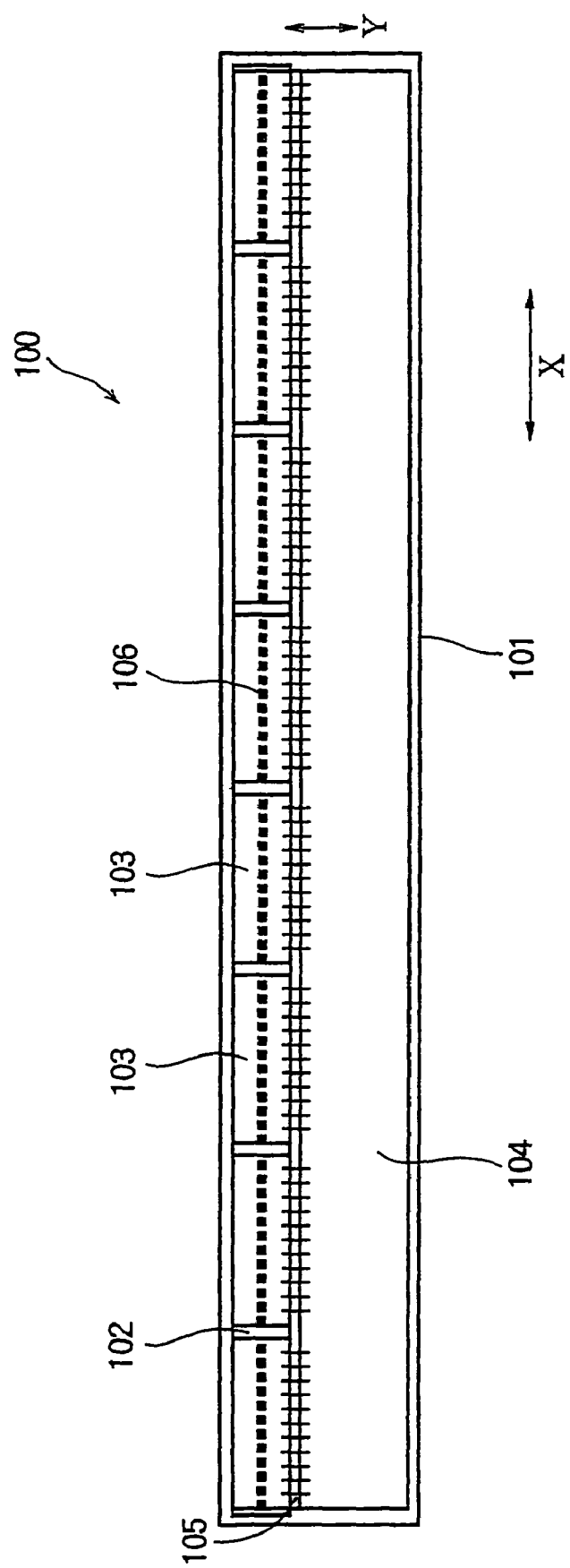
FIG. 2 is a plan view schematically showing the integrated LED/driving-IC chip in FIG. 1.
Figure 3:
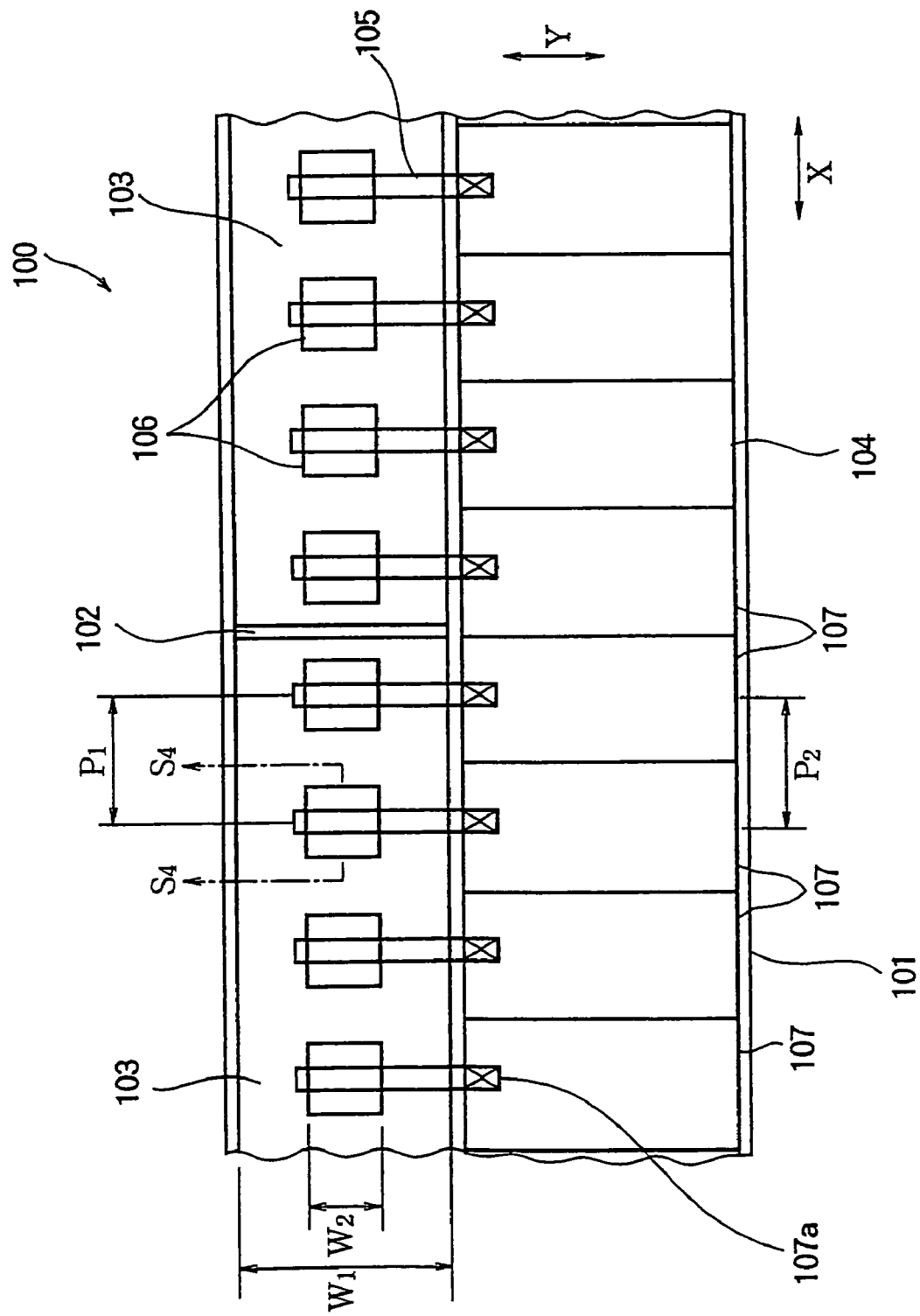
FIG. 3 is a more detailed plan view schematically showing part of the integrated LED/driving-IC chip in FIG. 1.

A first embodiment of the invented semiconductor apparatus, shown schematically in perspective view in FIG. 1 and plan view in FIGS. 2 and 3, is an integrated LED/driving-IC chip 100 having a substrate 101, a metal layer 102 disposed in tight contact with part of the surface of the substrate 101, a plurality of thin semiconductor films, referred to below as LED epitaxial films 103, bonded to the surface of the metal layer 102, and a thin integrated circuit film 104 bonded to the surface of the substrate 101, interconnected to the LED epitaxial films 103 by a plurality of individual interconnecting lines 105, which are more explicitly indicated in FIG. 3.

The substrate 101 may be an insulating substrate such as a glass, resin, or ceramic substrate. Alternatively, the substrate 101 may be a metal substrate or a semiconductor substrate.

The metal layer 102 is formed on the surface of the substrate 101 in a region adjacent to but not overlapping the part to which the thin integrated circuit film 104 is bonded. The metal layer 102 is, for example, a palladium or gold film with a thickness of about one hundred nanometers (100 nm=0.1 µm). The LED epitaxial films 103 are bonded to the surface of the metal layer 102. The functions of the metal layer 102 include both bonding of the LED epitaxial films 103 and electrical connecting of a common terminal area (not visible) on the bottom surface of the LED epitaxial film to a common terminal area (not visible) on the substrate 101. An ohmic contact is preferably formed between the metal layer 102 and the common terminal area on the substrate 101. The common terminal areas of the LED epitaxial films 103 in this embodiment is an n-type GaAs layer that occupies the entire undersurface of the LED epitaxial film. The common terminal area of the substrate 101 indicates a substrate region contacting the metal layer 102 provided on the substrate 101.

In a modification of the first embodiment, the common terminal area of the substrate 101 includes terminals formed on the substrate 101, making contact with both the metal layer 102 and the thin integrated circuit film 104. In another modification, the metal layer 102 covers the entire surface of the substrate 101 and the LED epitaxial films 103 and thin integrated circuit film 104 are both bonded to the surface of the metal layer 102.

As shown in FIG. 3, a plurality of light-emitting diodes 106 (LEDs, also referred to below as light-emitting parts or regions) are formed at regular intervals in the LED epitaxial films 103. The LEDs 106 are aligned in the longitudinal direction or X-direction of the substrate 101 to form a row of LEDs with an array pitch denoted $P_1$ in FIG. 3. In the orthogonal direction or Y-direction, the LED epitaxial films 103 have a width $W_1$ greater than the width $W_2$ of the light-emitting regions or LEDs 106. For example, the LED width $W_2$ may be 20 µm and the width $W_1$ of the LED epitaxial films 103 may be 50 µm, leaving a margin of 15 µm on both sides of the LEDs 106. The width $W_1$ of the LED epitaxial films 103 is much less than a substrate thickness (typically about 400 µm) of a conventional LED array chip having electrode pads.

The invention is not limited to a single regular row of LEDs. The LEDs 106 may be disposed in two or more linear arrays offset in the Y-direction, and the intervals between the LEDs 106 need not all be the same. The number of LEDs is not restricted to the ninety-six seen in FIG. 2. The widths $W_1$ of the LED epitaxial films 103 and $W_2$ of the light-emitting regions 105 are not limited to the values mentioned above.

The LED epitaxial films 103 are preferably grown as an epitaxial film on a separate substrate, as will be described below, and then transferred onto the metal layer 102. The thickness of the LED epitaxial films 103 may be about 2 µm, which is sufficient to obtain stable LED operating characteristics (for example, light-emitting characteristics and electrical characteristics). This thickness is much thinner than the conventional thickness (typically about 300 µm) of an LED array chip having electrode pads. The probability of open-circuit faults in the individual interconnecting lines 105 increases as the thickness of the LED epitaxial films 103 and the resulting step height at their edges increases. To avoid the occurrence of this type of defect, the thickness of the LED epitaxial films 103 is preferably less than 10 µm.

The thin integrated circuit film 104 is a thin semiconductor film in which an integrated circuit is fabricated. As shown in FIG. 3, the integrated circuit comprises a plurality of driving circuits 107 that drive individual LEDs 106, the driving circuits 107 forming repeating circuit units in the integrated circuit. The driving circuits 107 are disposed at regular intervals, facing the plurality of LEDs 106. Besides the driving circuits 107, the thin integrated circuit film 104 includes shared circuitry for illumination control of the LEDs 106. The thickness of the thin integrated circuit film 104 is on the same order as the thickness of the LED epitaxial films 103, e.g., less than 10 µm.

In a modification of the first embodiment, a dielectric film such as a polyimide film is used to planarize the steps at the edges of the LED epitaxial films 103 and the thin integrated circuit film 104. The thicknesses of the LED epitaxial films 103 and the thin integrated circuit film 104 may then be greater than 10 μm.

Referring to FIG. 3, when the LEDs 106 are disposed in a single row with an array pitch $P_1$, the driving circuits 107 are preferably arranged in an array extending in the same direction (the X-direction in the drawings), with a substantially equal array pitch $P_2$, so that the driving circuits 107 face the LEDs they drive.

The individual interconnecting lines 105 electrically interconnect the upper surfaces of the light-emitting regions 105 in the LED epitaxial films 103 with individual driving terminals 107a in the driving circuits 107 on the substrate 101. The individual interconnecting lines 105 may be formed by patterning a thin conductive film. Specific examples of suitable films include a single-layer gold film, a multi-layer film with titanium, platinum, and gold layers (a Ti/Pt/Au film), a multi-layer film with gold and zinc layers (an Au/Zn film), a multi-layer film with a gold layer and a gold-germanium-nickel layer (an AuGeNi/Au film), a single-layer palladium film, a multi-layer film with palladium and gold layers (a Pd/Au film), a single-layer aluminum film, a multi-layer film with aluminum and nickel layers (an Al/Ni film), a polycrystalline silicon (polysilicon) film, an indium tin oxide (ITO) film, a zinc oxide (ZnO) film, and various combinations of these films.

When the individual interconnecting lines 105 are formed from a thin film, since their width is restricted by the array pitch $P_1$ of the LEDs 106, a significant voltage drop will occur if the individual interconnecting lines 105 are too long, particularly in a dense linear array in which the array pitch $P_1$ is relatively small. If several mill amperes of driving current must be supplied through an individual interconnecting line 105 that is 5 μm wide and 0.5 μm thick, for example, the length of the individual interconnecting line is preferably less than about 200 μm.

Short circuits between the individual interconnecting lines 105 and the top and side surfaces of the LED epitaxial films 103, the metal layer 102, the surface of the substrate 101, and the driving circuits 107 are prevented by an interlayer dielectric film (the dielectric film 117 shown in FIGS. 4, 6D, and 6E) that insulates the individual interconnecting lines 105 from these regions as necessary.

Figure 4:
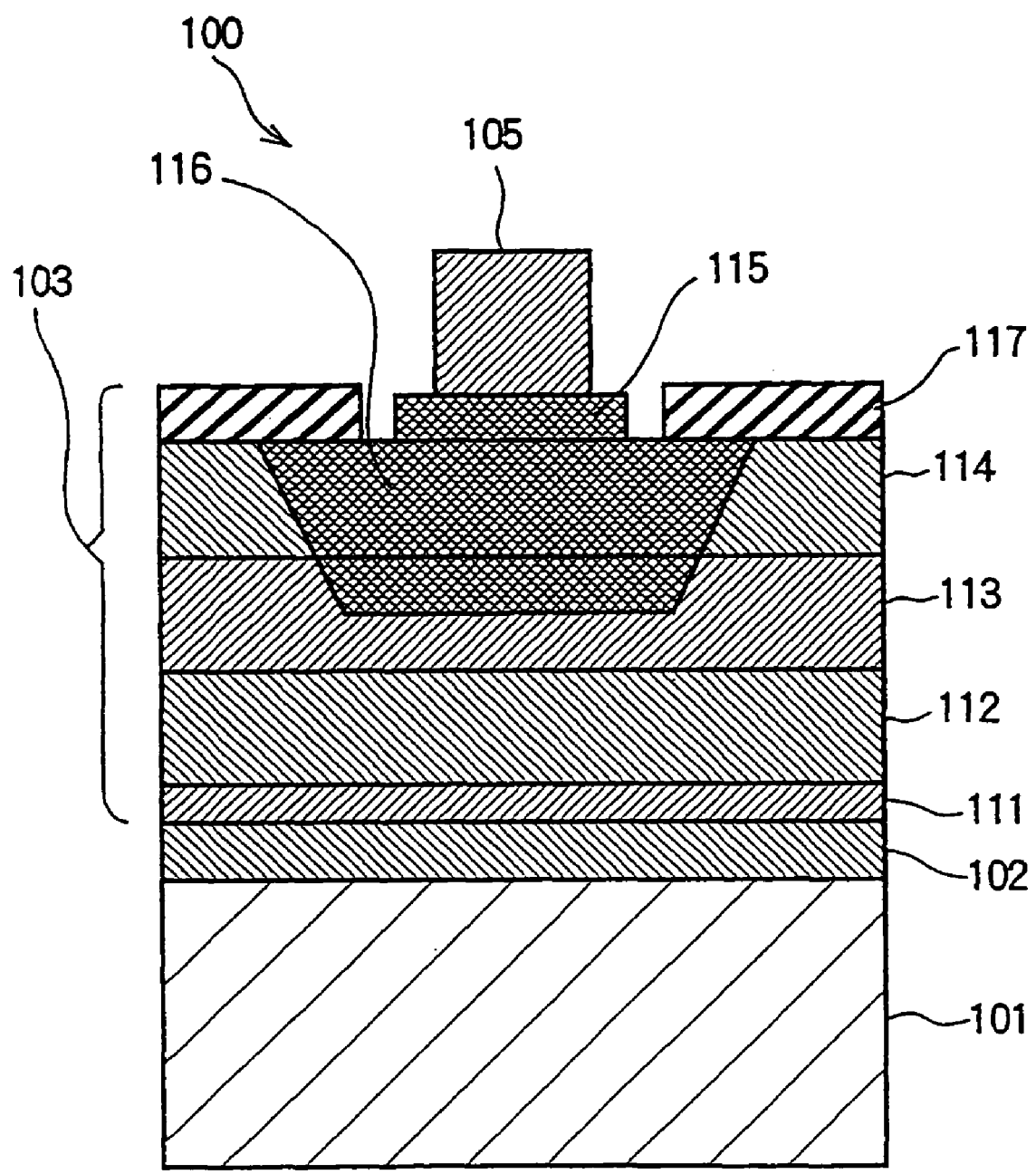
FIG. 4 is a cross sectional view schematically showing a cross section through line $S_4$-$S_4$ in FIG. 3.

Referring to FIG. 4, the LED epitaxial films 103 comprise, from the bottom up, an n-type gallium arsenide (GaAs) layer 111 and three n-type aluminum gallium arsenide (AlGaAs) layers: an $Al_xGa_{1-x}As$ lower cladding layer 112 ($0 \leq x < 1$), an $Al_yGa_{1-y}As$ active layer 113 ($0 \leq y < 1$), and an $Al_zGa_{1-z}As$ upper cladding layer 114 ($0 \leq z < 1$). A second n-type GaAs contact layer is formed on the n-type $Al_zGa_{1-z}As$ layer 114 and then partially removed and partially doped with zinc (Zn) to create a p-type GaAs contact layer 115 for each LED. Each LED also includes a p-type zinc diffusion region 116 formed in the n-type $Al_yGa_{1-y}As$ active layer 113 and n-type $Al_zGa_{1-z}As$ upper cladding layer 114. Light is emitted when forward current is supplied across the pn junction at the interface between the p-type and n-type regions. The part of the second GaAs layer including the pn junction is removed, leaving the p-type GaAs contact layer 115 as an island within each LED. The part of the n-type $Al_zGa_{1-z}As$ upper cladding layer 114 including the pn junction is covered by the dielectric film 117 mentioned above, which may be considered as part of the LED epitaxial film 103.

The n-type GaAs layer 111 is about 10 nm (0.01 μm) thick, the n-type $Al_xGa_{1-x}As$ lower cladding layer 112 is about 0.5 μm thick, the n-type $Al_yGa_{1-y}As$ active layer 113 is about 1 μm thick, the n-type $Al_zGa_{1-z}As$ upper cladding layer 114 is about 0.5 μm thick, and the p-type GaAs contact layer 115a about 10 nm (0.01 μm) thick. The total thickness of the LED epitaxial film 103 is about 2.02 μm.

The aluminum composition ratios x, y, z of the AlGaAs layers are preferably selected so that $x > y$ and $z > y$ (e.g., $x = z = 0.4$, $y = 0.1$), and the diffusion front of the zinc diffusion region 116 is preferably located within the n-type $Al_yGa_{1-y}As$ active layer active 113. With this structure, minority carriers injected through the pn junction are confined within the n-type $Al_yGa_{1-y}As$ active layer 113 and the p-type $Al_yGa_{1-y}As$ region created therein by zinc diffusion, so that high luminous efficiency is obtained. The structure shown in FIG. 4 enables high luminous efficiency to be obtained with an LED epitaxial film 103 as thin as about 2 μm.

The LED epitaxial film 103 is not limited to the thicknesses or materials given above. Other materials, such as aluminum-gallium indium phosphide (($Al_xGa_{1-x})_yIn_{1-y}P$, where $0 \leq x < 1$ and $0 \leq y < 1$), gallium nitride (GaN), aluminum gallium nitride (AlGaN), and indium gallium nitride (InGaN) may also be employed. The LED shown in FIG. 4 has a double hetero-junction structure, but it is also possible to fabricate LEDs with a single hetero-junction structure or a homojunction structure, by forming a diffusion region in an epitaxial layer of the single hetero-multilayer type or the single-layer type.

Figure 5:
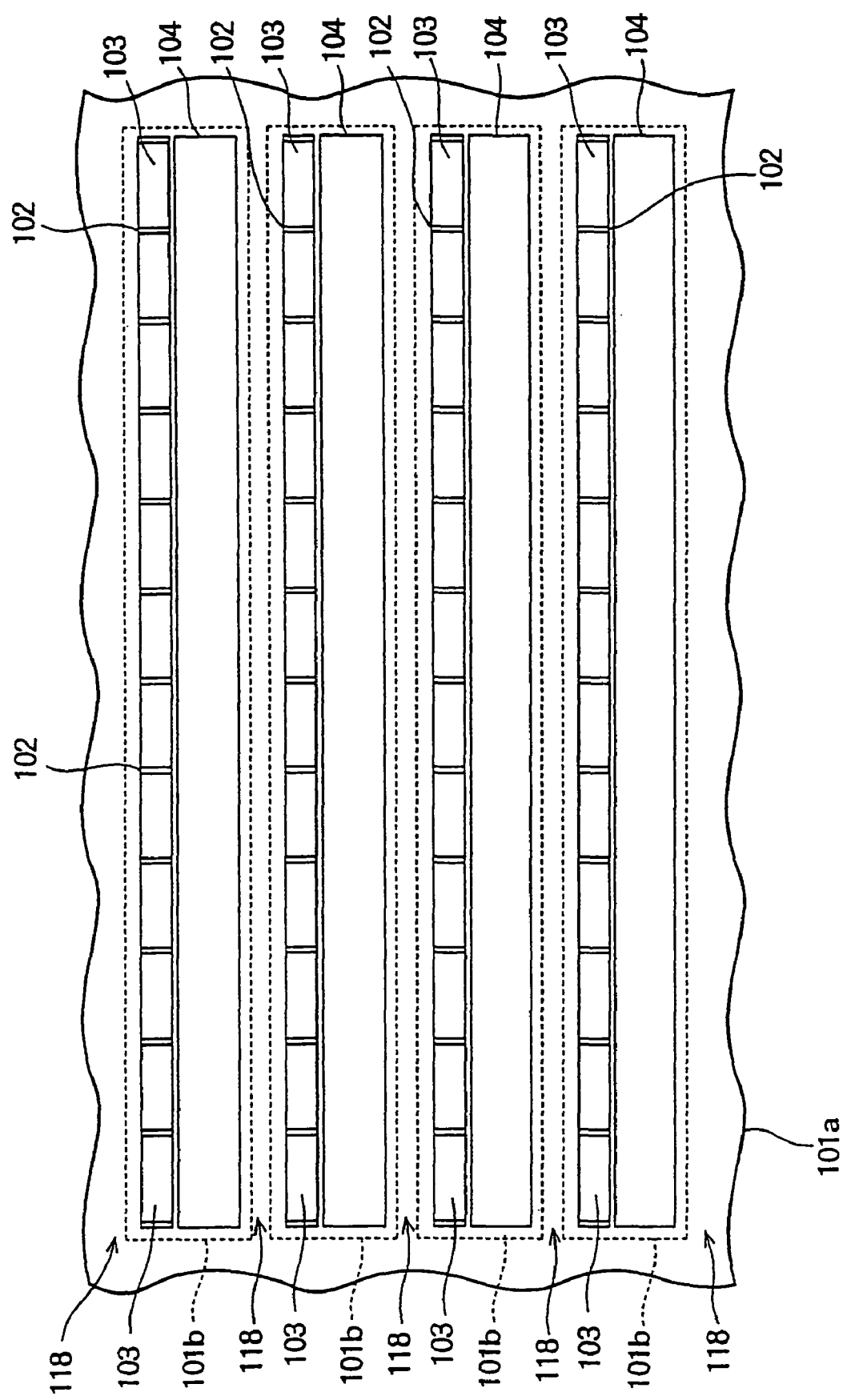
FIG. 5 is a plan view of a semiconductor wafer on which integrated LED/driving-IC chips are fabricated according to the first embodiment of the invention.

Next, a method of fabricating the integrated LED/driving-IC chip 100 will be described. In this method, a plurality of integrated LED/driving-IC chips are formed simultaneously on a wafer substrate 101a as shown in FIG. 5. Steps in the fabrication process are illustrated in FIGS. 6A to 6E, which show part of one integrated LED/driving-IC chip.

In the fabrication process, first a layer of metal is deposited on the wafer substrate 101a and patterned by lift-off, for example, to leave a metal layer 102 in each chip formation area 101a. LED epitaxial films 103 are then bonded to each metal layer 102 and the thin integrated circuit film 104 is bonded to the substrate 101a in each chip formation area 101b, as shown in FIG. 6B. The LED epitaxial films 103 and thin integrated circuit films 104 may be bonded in either order. A dielectric film 117 is then formed so as to cover necessary parts of the substrate 101a, metal layers 102, LED epitaxial films 103, and thin integrated circuit films 104, as shown in FIG. 6C. The individual interconnecting lines 105 are formed on the dielectric film 117 as shown in FIG. 6D, by photolithography. The wafer substrate 101a is then diced along-dicing lines 118 shown in FIG. 5 and separated into individual integrated LED/driving-IC chips 100, as shown in FIG. 6E.

The area covered by the dielectric film 117 need not be the area shown in these drawings. For example, the dielectric film 117 can be formed so as to cover only the LED epitaxial films 103 and metal layer 102.

To form ohmic contacts between the metal layer 102 and the common terminal area (not visible) on the underside of the LED epitaxial films 103, and between the metal layer 102 and the common terminal area (not visible) on the substrate 101, after the LED epitaxial films 103 have been placed in tight contact with the metal layer 102, the wafer is annealed at a temperature of 200° C. to 250° C. This annealing also strengthens the bonds between the LED epitaxial films 103 and the metal layer 102. Similarly, after the individual interconnecting lines 105 have been formed by photolithography, the wafer is annealed at a temperature of about 200° C. to form ohmic contacts.

Next, a fabrication process for the LED epitaxial films 103 will be described with reference to FIGS. 7 to 10. The illustrated process simultaneously creates a plurality of LED epitaxial films 103 for bonding to a plurality of integrated LED/driving-IC chips 100.

Figure 7:
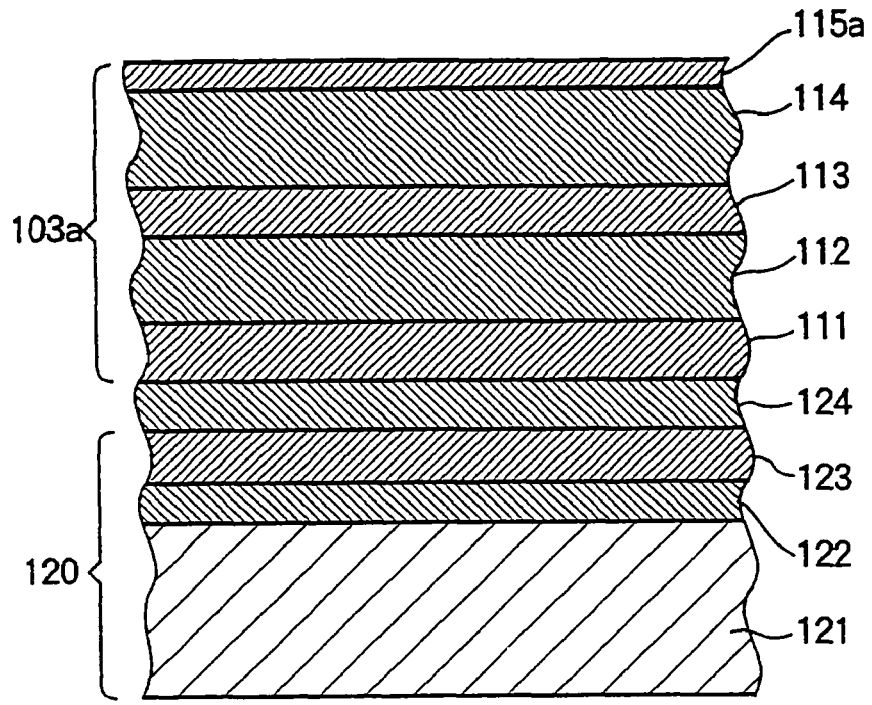
FIG. 7 is a cross sectional view schematically showing a first stage in an LED epitaxial-film fabrication process.

Referring to FIG. 7, the fabrication process begins with the formation of an LED epitaxial layer 103a on a fabrication substrate 120 by well-known techniques such as metal organic chemical vapor deposition (MOCVD) or molecular beam epitaxy (MBE). The LED epitaxial film fabrication substrate 120 in FIG. 7 includes a GaAs substrate 121, a GaAs buffer layer 122, an aluminum-gallium indium phosphide ((AlGa)InP) etching stop layer 123, and an aluminum arsenide (AlAs) sacrificial layer 124. The n-type GaAs contact layer 111, n-type $Al_xGa_{1-x}As$ lower cladding layer 112, n-type $Al_yGa_{1-y}As$ active layer 113, n-type $Al_zGa_{1-z}As$ upper cladding layer 114, and n-type GaAs contact layer 115a are formed in this order on the AlAs sacrificial layer 124, creating the LED epitaxial layer 103a.

The structure shown in FIG. 7 is capable of modification. Various layers may be added, for example, and the etching stop layer 123 may be omitted if it is not needed.

Figure 8:
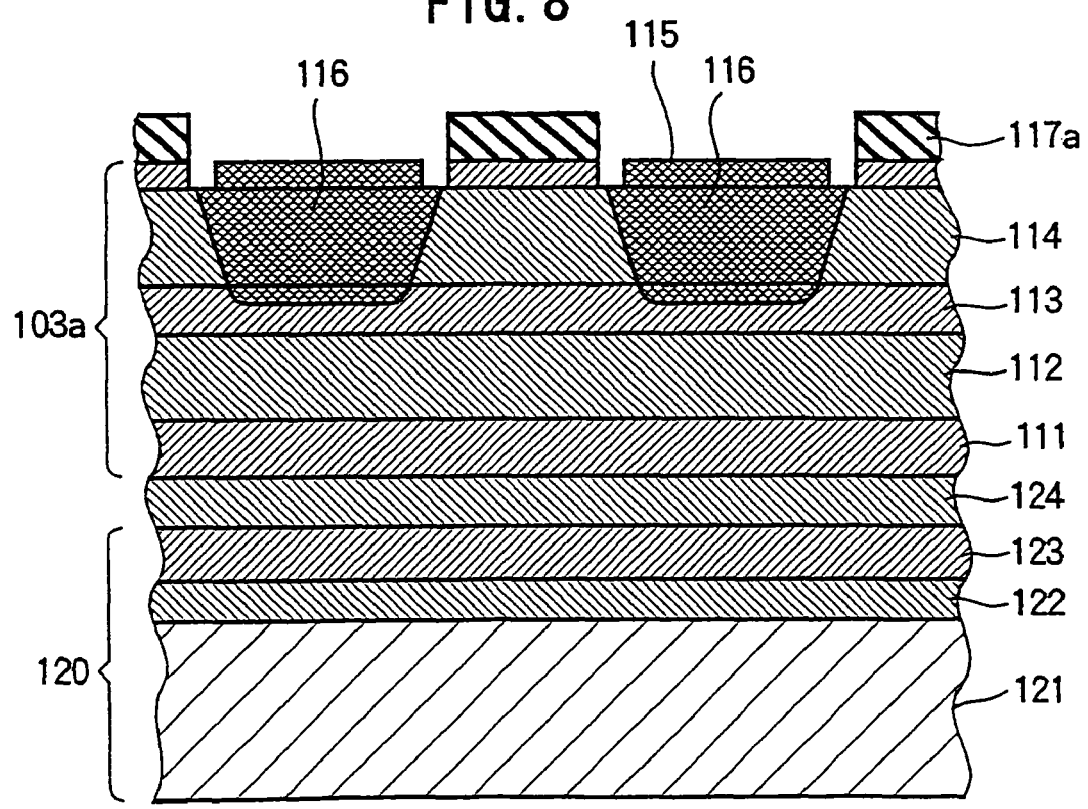
FIG. 8 is a cross sectional view schematically showing a second stage in the LED epitaxial-film fabrication process.

Referring to FIG. 8, an interlayer dielectric film 117a is now formed, openings are created therein, and a p-type impurity comprising zinc (Zn) is diffused through the appropriate openings by, for example, a solid-phase diffusion method to create the zinc diffusion regions 116. The diffusion source film (not shown) used for the solid-phase diffusion process is then removed to expose the surface of the GaAs contact layer in the zinc diffusion regions 116. Due to the p-type impurity diffusion, the n-type GaAs contact layer 115a has become a p-type GaAs contact layer 115 in these regions. The part of the GaAs contact layer including the pn junction is preferably removed by etching, as shown in FIG. 8.

Figure 9:
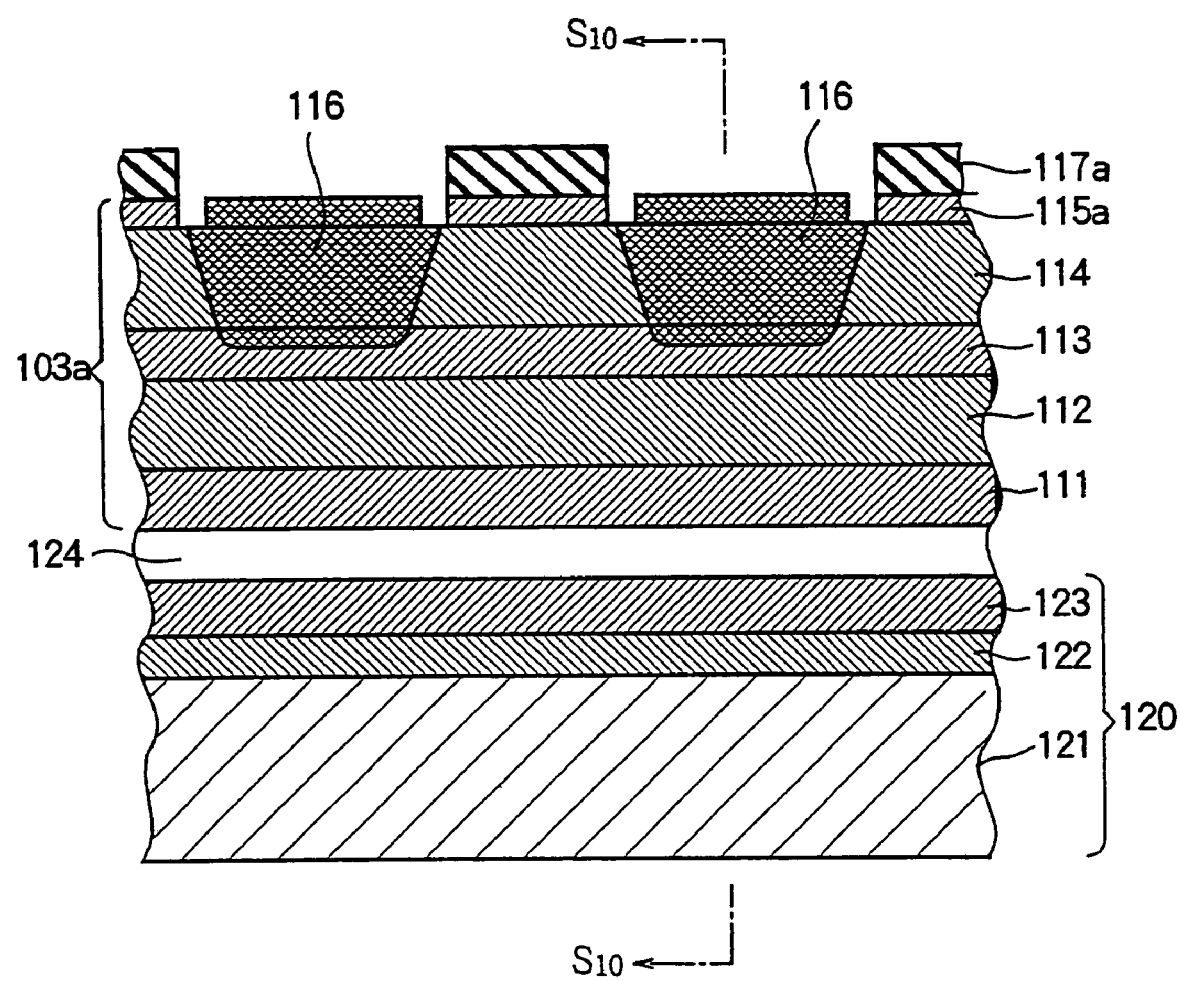
FIG. 9 is a cross sectional view schematically showing a third stage in the LED epitaxial-film fabrication process.
Figure 10:
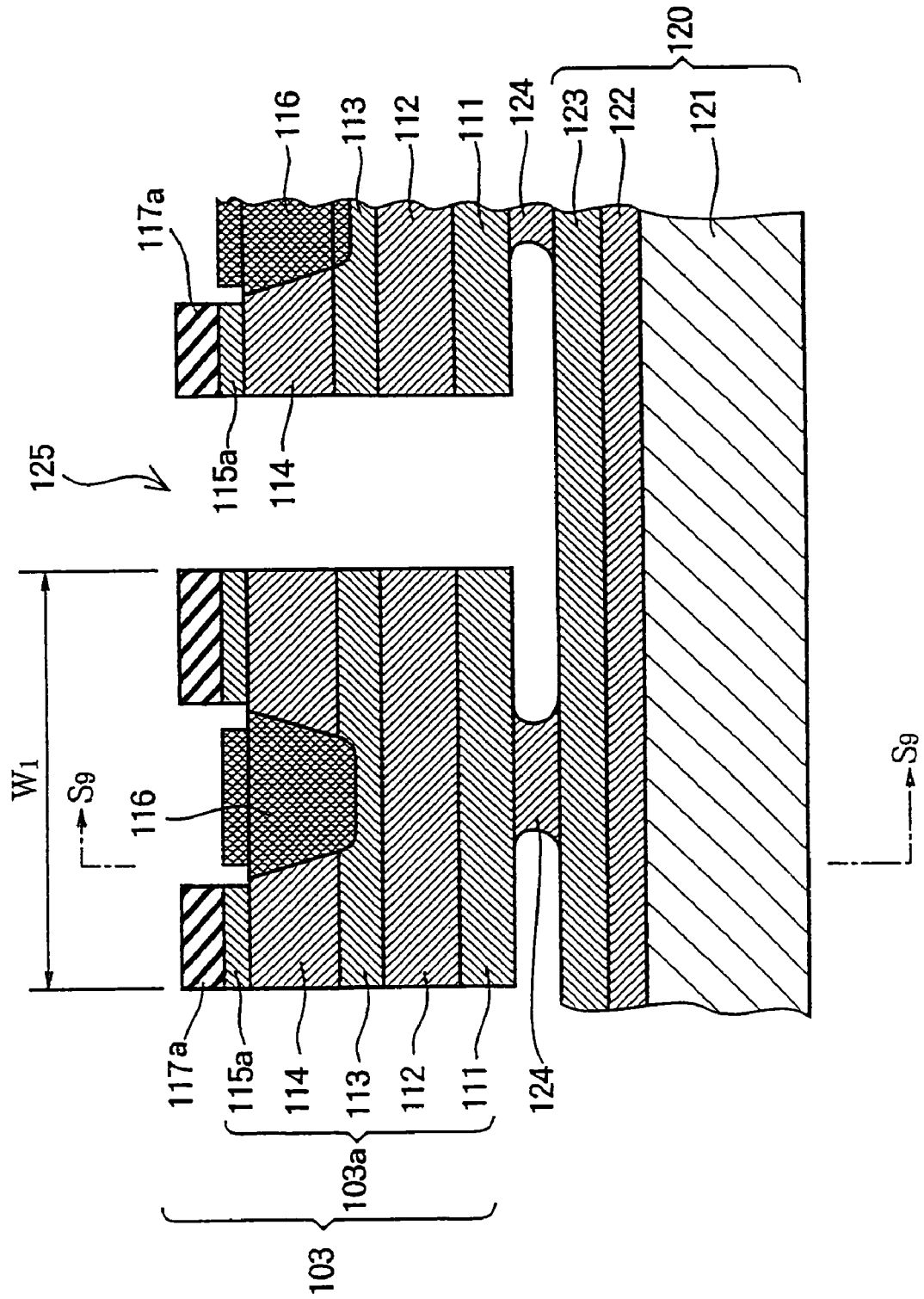
FIG. 10 is a cross sectional view schematically showing a cross section through line $S_9$-$S_9$ in FIG. 9.

Referring FIGS. 9 and 10, the LED epitaxial films are now lifted off from the fabrication substrate 120. Parallel trenches 125 are formed in the LED epitaxial layer 103a by photolithography and etching. For simplicity, the photoresist mask used in these processes is not shown in the drawings, and only one trench 125 is shown (in FIG. 10). The etchant is a solution of phosphoric acid and hydrogen peroxide, which etches the AlGaAs layers 112, 113, 114 and GaAs layers 111, 115, much faster than (AlGa)InP etching stop layer 123. Therefore etching to form the trench 125 stops at the surface of the etching stop layer 123. When the trench 125 is formed, part of the surface of the sacrificial layer 124 should be exposed to the etchant. Although the phosphoric acid/hydrogen peroxide solution does not necessarily etch the interlayer dielectric film 117a, the interlayer dielectric film 117a is removed from the areas in which the trenches 125 will be etched. The same photoresist mask can be used for removing the dielectric film 117a from these areas and for etching the trenches 125. The (AlGa)InP etching stop layer 123 ensures that the trench etching process does not excavate the GaAs substrate 121.

FIG. 9, which shows a cross section through line $S_9$-$S_9$ in FIG. 10, gives a side view of what will become one LED epitaxial film 103. FIG. 10 shows end sectional views of what will become two LED epitaxial films 103. The interval between trenches 125 defines the LED epitaxial film width denoted $W_1$ in FIG. 3. To enable the fabrication of thin LED epitaxial films and to enable them to be separated from the LED epitaxial film fabrication substrate 120 in a relatively short time, the width $W_1$ is preferably less than 300 μm. A small width $W_1$ (such as the 50-μm width mentioned earlier) also increases the number of LED epitaxial films that can be formed simultaneously, thereby reducing the material cost and total fabrication cost of each LED epitaxial film.

Referring to FIGS. 9 and 10, after the formation of trenches 125, the AlAs sacrificial layer 124 is selectively etched with, for example, a 10% hydrofluoric acid (HF) solution. Since the HF etching rate of the AlAs layer 124 is much faster than that of the AlGaAs layers 112 to 114, the GaAs layers 111, 115, 121, and 122 and the (AlGa)InP etching stop layer 123, the AlAs sacrificial layer 124 can be etched without significant damage to these other layers. FIG. 10 shows an intermediate stage in the etching process, in which part of the AlAs sacrificial layer 124 still remains. By the end of the etching process, the AlAs sacrificial layer 124 is completely removed, as shown in FIG. 9, enabling the LED epitaxial films 103 to be detached from the fabrication substrate 120.

After the AlAs sacrificial layer 124 has been completely removed by etching, the LED epitaxial films 103 are cleansed with deionized water so that no etching solution residue remains. Then each LED epitaxial film 103 is lifted from the fabrication substrate 120 by, for example, a vacuum suction jig, transferred to the metal layer 102 on the substrate 101, and bonded thereto as explained above.

To protect the LED epitaxial films 103 during the etching processes and facilitate their handling during the separation and attachment processes, a protective supporting layer (not shown) may be formed on the LED epitaxial layer 103a before formation of the trenches 125, and removed from the LED epitaxial films 103 after they have been bonded to the metal layer 102.

Figure 11A:
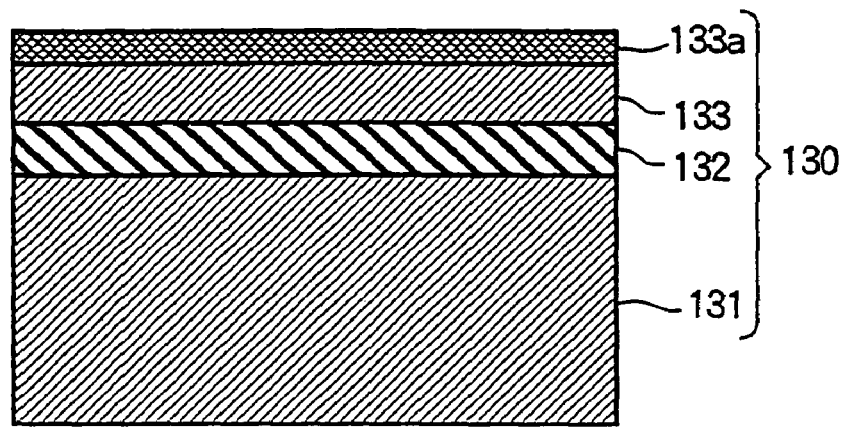
FIGS. 11A, 11B, and 11C are cross sectional views schematically showing steps in a fabrication process for the thin integrated circuit film in FIG. 1.
Figure 11B:
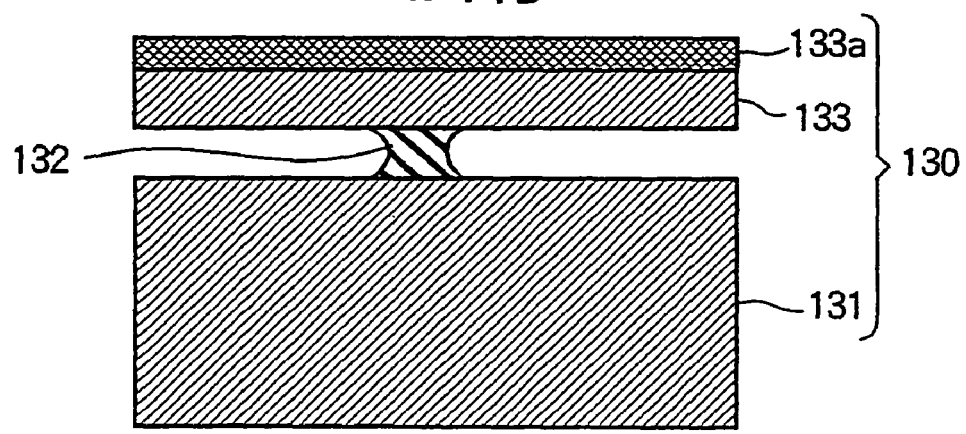

Next, the fabrication of the thin integrated circuit film 104 will be described with reference to FIGS. 11A to 11C. In the process described, the thin integrated circuit film 104 is fabricated on a silicon-on-insulator (SOI) substrate 130 comprising a silicon substrate 131, a buried oxide layer 132, and a semiconductor silicon layer 133. The buried oxide layer 132 is a silicon dioxide ($SiO_2$) layer, also referred to as a BOX layer. The semiconductor silicon layer 133 is also referred to as an SOI layer. In FIG. 11A, an integrated circuit 133a is formed near the surface of the semiconductor silicon layer 133. Next, as shown in FIG. 11B, the $SiO_2$ layer 132 is selectively etched with, for example, HF. FIG. 11B shows an intermediate stage in the etching process; when the etching process ends, the $SiO_2$ layer 132 is completely removed. The semiconductor silicon layer 133, including the integrated circuit 133a, is now lifted from the silicon substrate 131 by, for example, a vacuum suction jig, transferred to the desired location on the wafer substrate 101a, and attached to the wafer substrate 101a as a thin integrated circuit film 104, as shown in FIG. 11C.

Figure 11C:
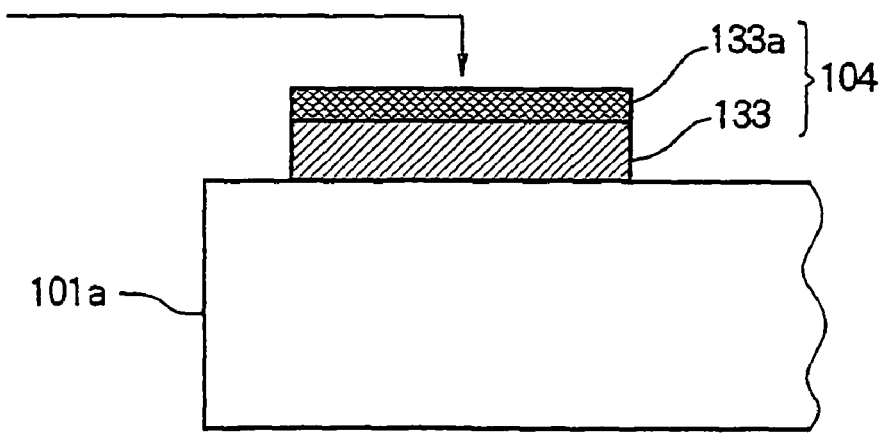

To protect the integrated circuit 133a during the etching of the $SiO_2$ layer 132, and to facilitate the handling of the thin integrated circuit film 104 during the separation and attachment processes, a protective supporting layer (not shown) may be formed on the semiconductor silicon layer 133 before the etching process shown in FIG. 11B, and removed after the attachment process shown in FIG. 11C.

One effect of the first embodiment is that since the LED epitaxial films 103 are electrically connected to the driving circuits 107 in the thin integrated circuit film 104 by thin-film individual interconnecting lines 105, no wire-bonding connections have to be made between the LED epitaxial films 103 and the driving circuits 107. Assembly costs can therefore be reduced, and the rate of occurrence of interconnection faults is reduced.

A related effect is that the area occupied by the LED epitaxial films 103 can be much smaller than the area occupied by a conventional LED array chip, and the area occupied by the thin integrated circuit film 104 can also be reduced, because no wire bonding pads need be provided for interconnections between the two. Furthermore, since the LED epitaxial films 103 are supported by the substrate 101 and need not be thickened to provide strength for wire bonding, they can be much thinner than conventional LED array chips. These effects lead to a substantial reduction in material costs. In particular, the necessary amount of relatively expensive compound semiconductor materials such as gallium arsenide can be greatly reduced, as compared with conventional LED array chips, even when the fabrication substrate 120 is taken into account.

A further effect is that, since the LEDs 106 in the LED epitaxial films 103 are close to their driving circuits 107, the individual interconnecting lines 105 can be correspondingly short, leading to a reduction in electrical resistance, not to mention an overall reduction in the combined width of the apparatus including the LEDs and their driving circuits. The integrated LED/driving-IC chip 100 thus takes up less space and can operate on less power than a conventional paired LED array chip and driver IC chip.

Furthermore, in the integrated LED/driving-IC chip 100 of the first embodiment, the metal layer 103 is disposed below the epitaxial film 104, and the epitaxial film 104 has an extremely thin thickness, for example, a thickness of about 2 µm. Accordingly, not only light is directly emitted upward from the LED 105 but also light emitted downward from the LED 105 is reflected by a surface of the metal layer 103 to travel upward through the epitaxial film 104. Therefore, luminous intensity of the integrated LED/driving-IC chip 100 can be increased.

Second Embodiment

Figure 12:
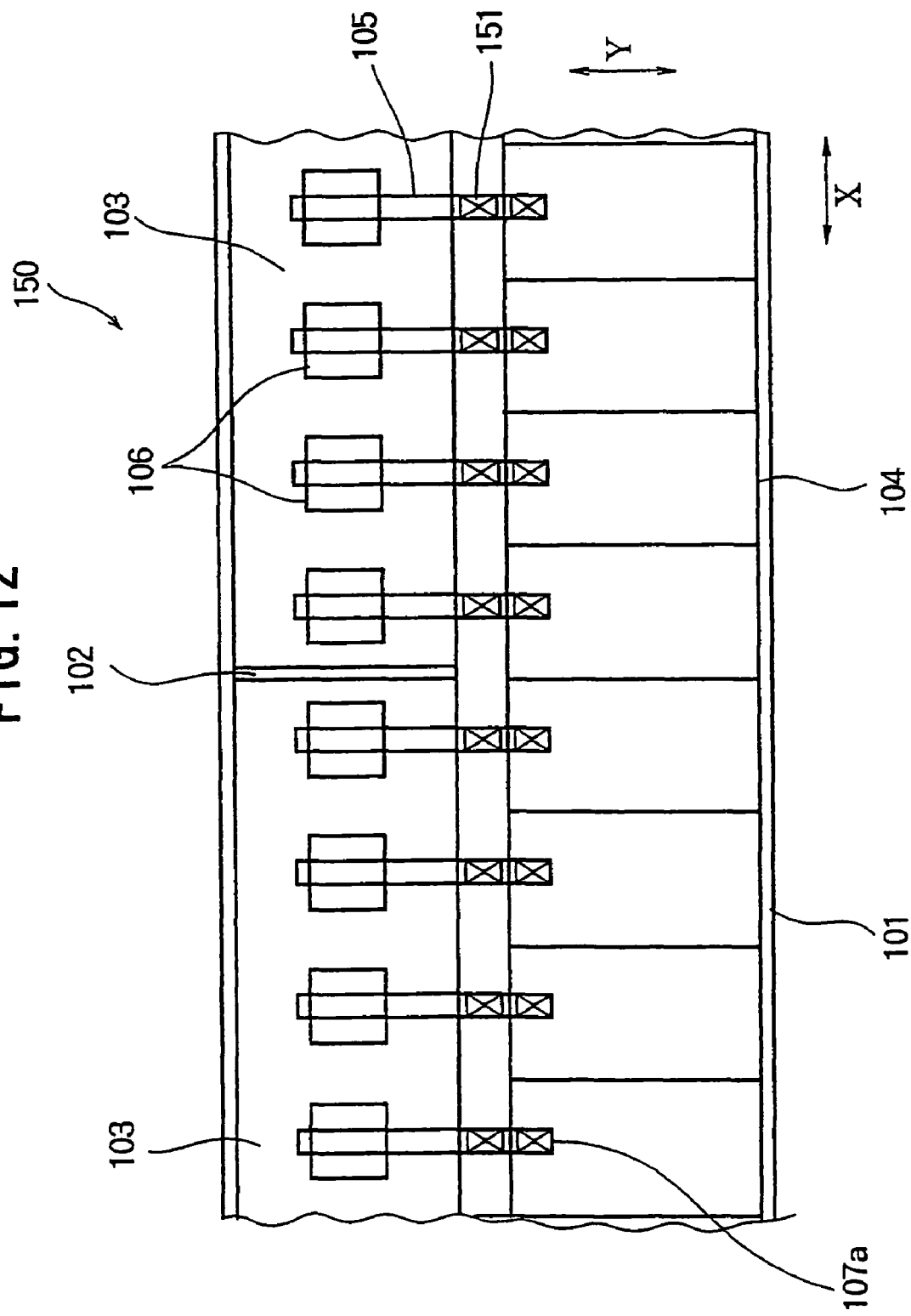
FIG. 12 is a plan view schematically showing part of an integrated LED/driving-IC chip according to a second embodiment of the invention.

A second embodiment of the invented semiconductor apparatus is shown schematically in partial plan view in FIG. 12. This integrated LED/driving-IC chip 150 differs from the integrated LED/driving-IC chip 100 in the first embodiment in that relay terminal areas 151 comprising a conductive material are provided on the substrate 101 between the LED epitaxial films 103 and the thin integrated circuit film 104. The individual interconnecting lines 105 extend from above the light-emitting parts of the LEDs 106 in the LED epitaxial films 103 to the relay terminal areas 151 on the substrate 101, then to the individual terminal areas 107a of the thin integrated circuit film 104. The relay terminal areas 151 make it possible to change the positional relationship between the LED epitaxial films 103 and thin integrated circuit film 104: for example, to separate them by a greater distance, as illustrated by a comparison of FIGS. 3 and 12.

Except for the foregoing point, the second embodiment is identical to the first embodiment described above.

Third Embodiment

Figure 13:
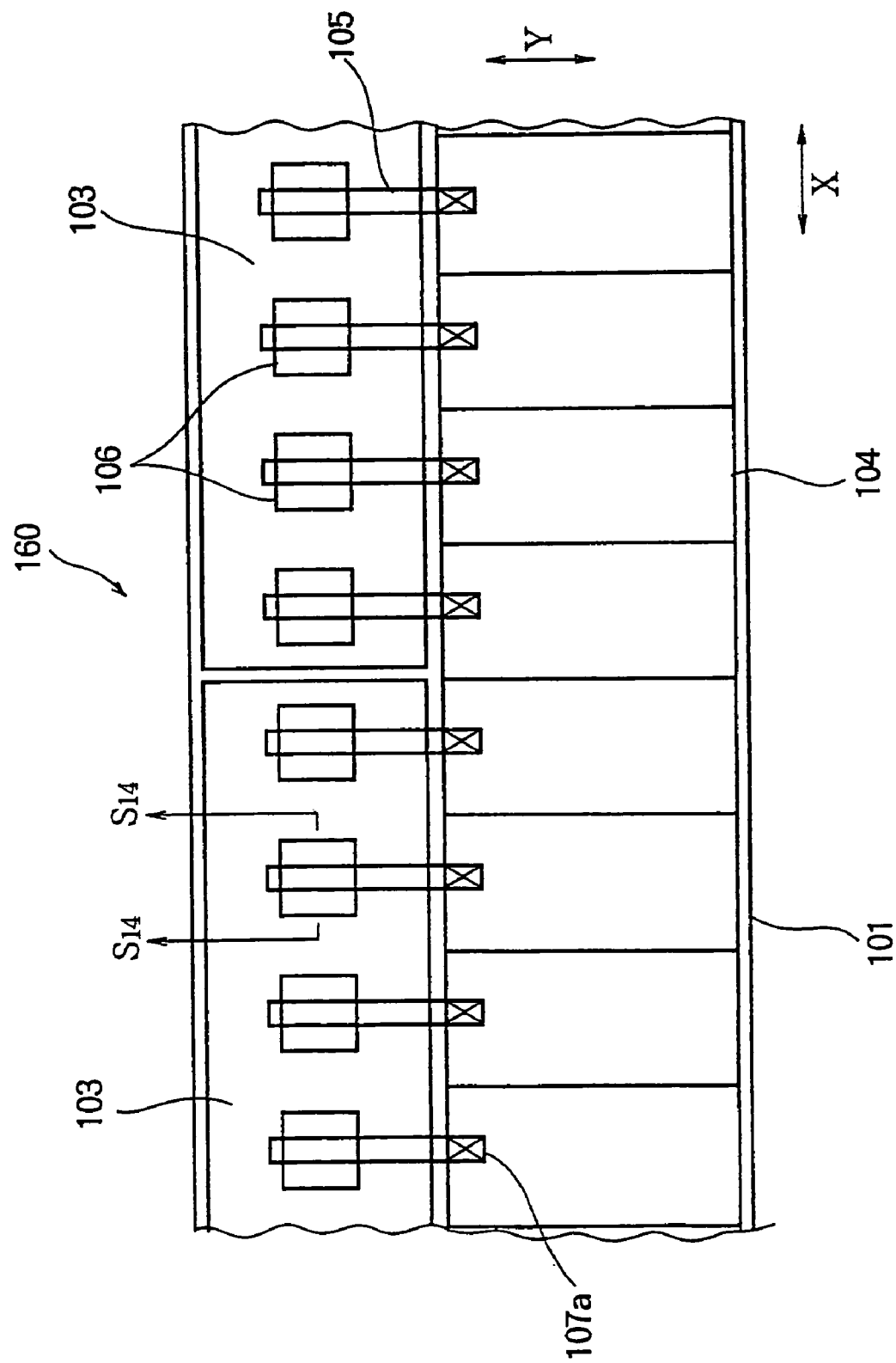
FIG. 13 is a plan view schematically showing part of an integrated LED/driving-IC chip according to a third embodiment.
Figure 14:
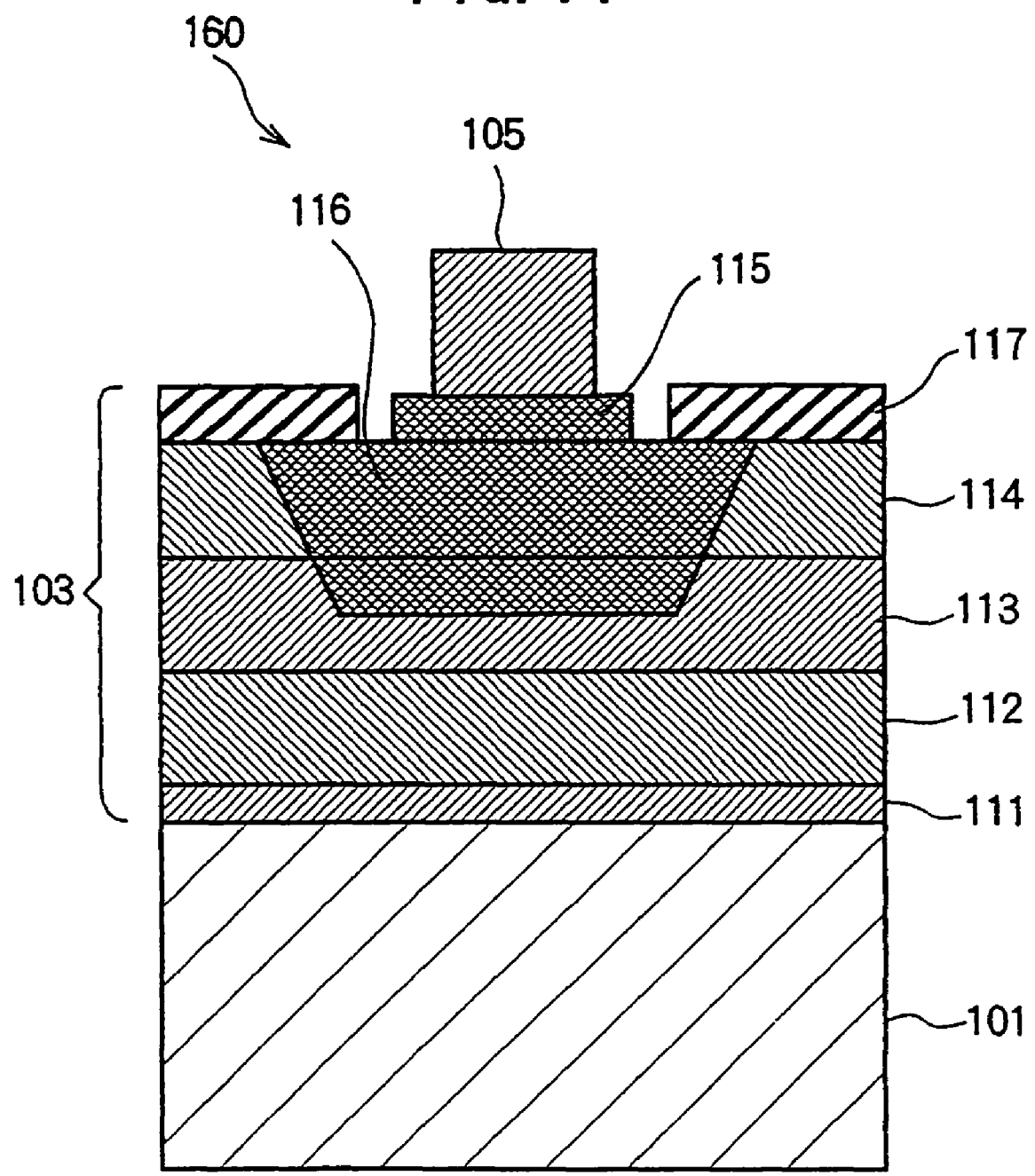
FIG. 14 is a cross sectional view schematically showing a cross section through line $S_{14}$-$S_{14}$ in FIG. 13.

A third embodiment of the invented semiconductor apparatus is shown schematically in partial plan view in FIG. 13 and in partial cross sectional view in FIG. 14. This integrated LED/driving-IC chip 160 differs from the integrated LED/driving-IC chip 100 in the first embodiment in that there is no metal layer between the LED epitaxial films 103 and the substrate 101. The upper surface of the substrate 101 and lower surface of the LED epitaxial films 103 are treated by an appropriate chemical method to remove contaminants and provide planarization to, for example, the order of one atomic layer, after which these two surfaces are placed in tight contact and bonded together by the application of pressure and heat.

Although the heating temperature necessary to achieve secure bonding is higher in the second embodiment than in the first embodiment, the second embodiment eliminates the possibility of bonding defects caused by thickness irregularities in the metal layer interposed between the LED epitaxial films and the substrate in the first embodiment. The alignment accuracy between the array of LEDs 106 and the array of driving circuits 107 can also be improved, because the error associated with the interposed metal layer is eliminated.

Aside from the absence of the metal layer, the third embodiment is identical to the first embodiment.

Fourth Embodiment

Figure 15:
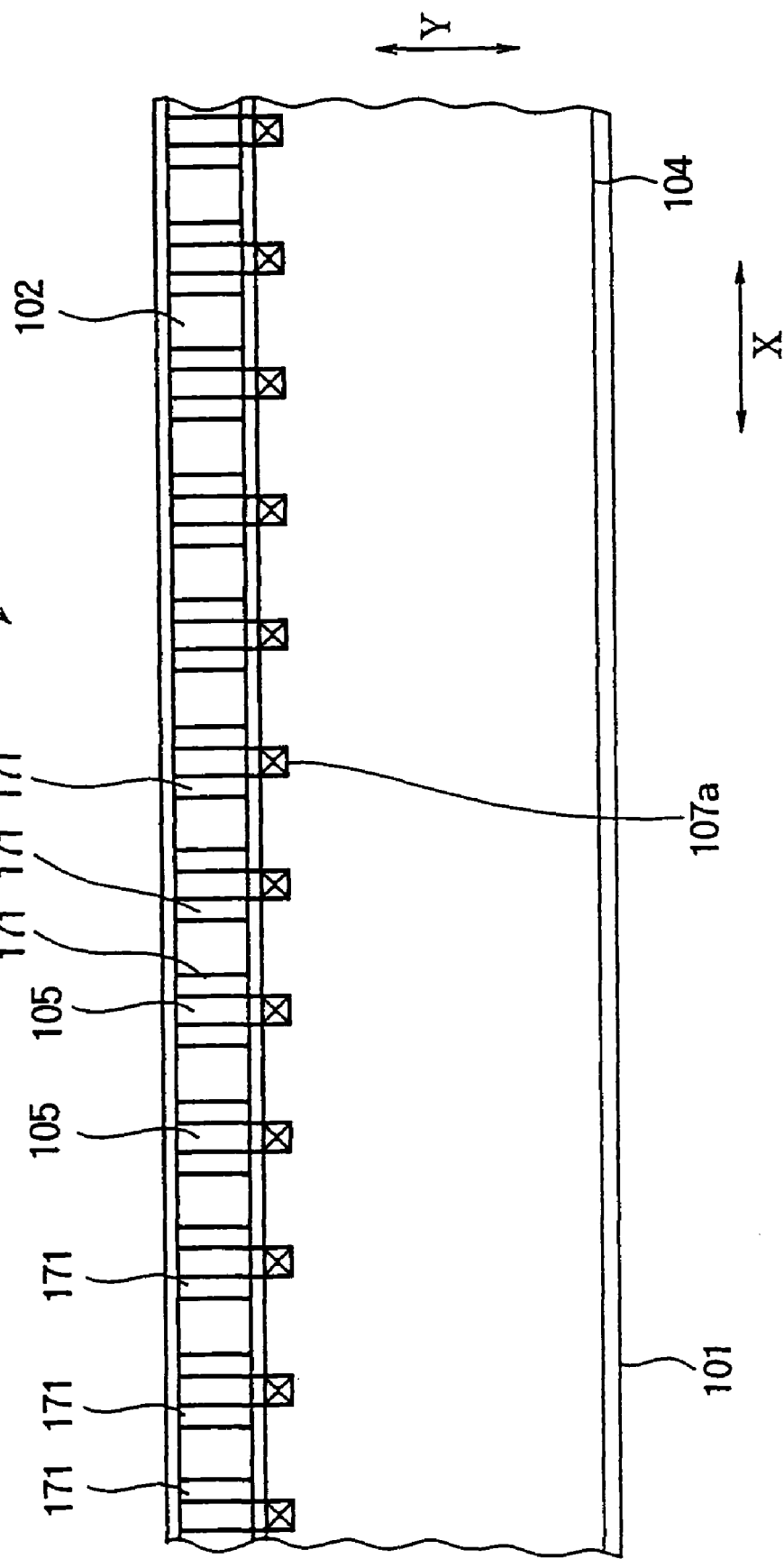
FIG. 15 is a plan view schematically showing part of an integrated LED/driving-IC chip according to a fourth embodiment of the invention.
Figure 16:
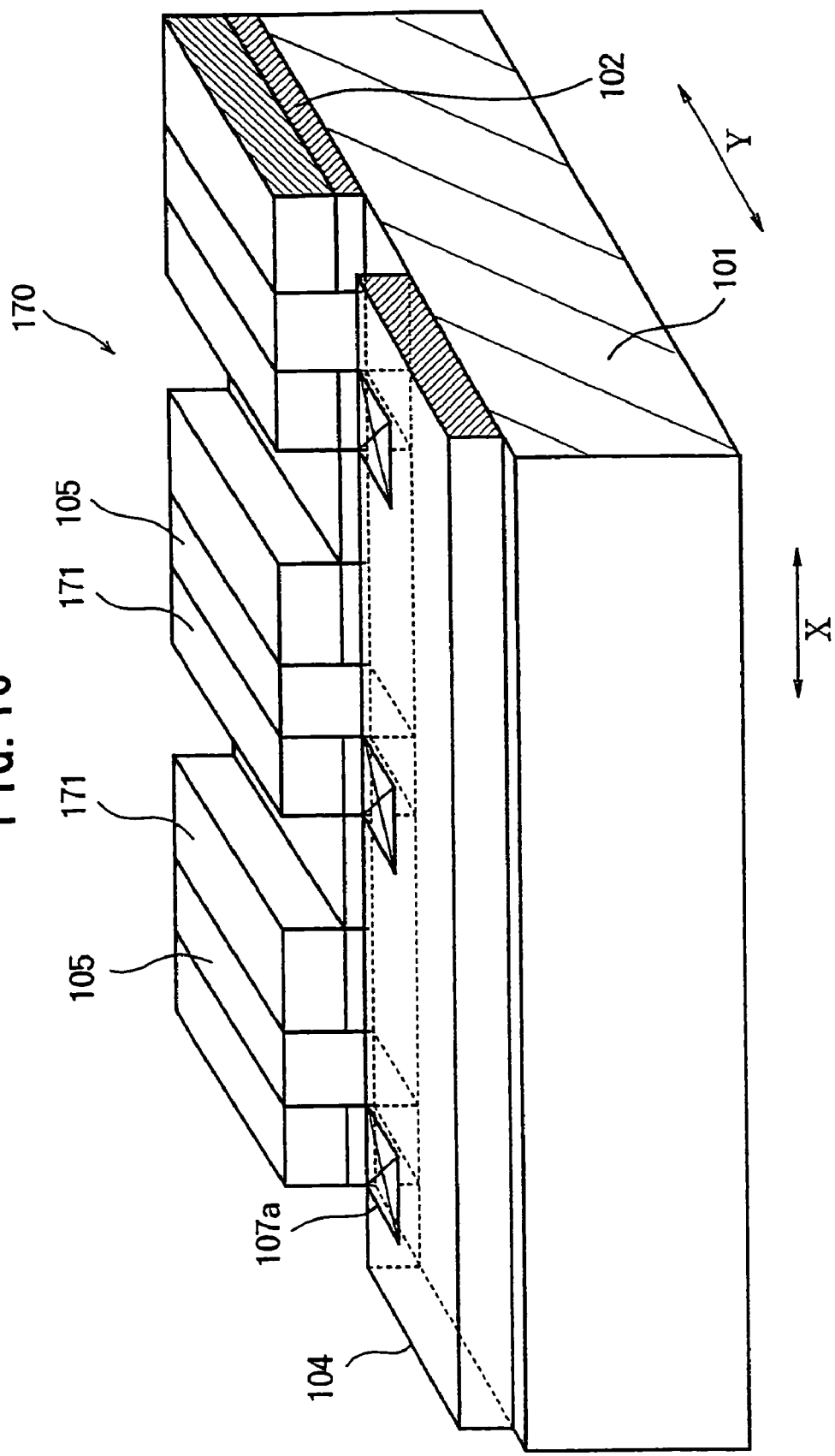
FIG. 16 is a perspective view schematically showing part of the integrated LED/driving-IC chip in FIG. 15.
Figure 17:
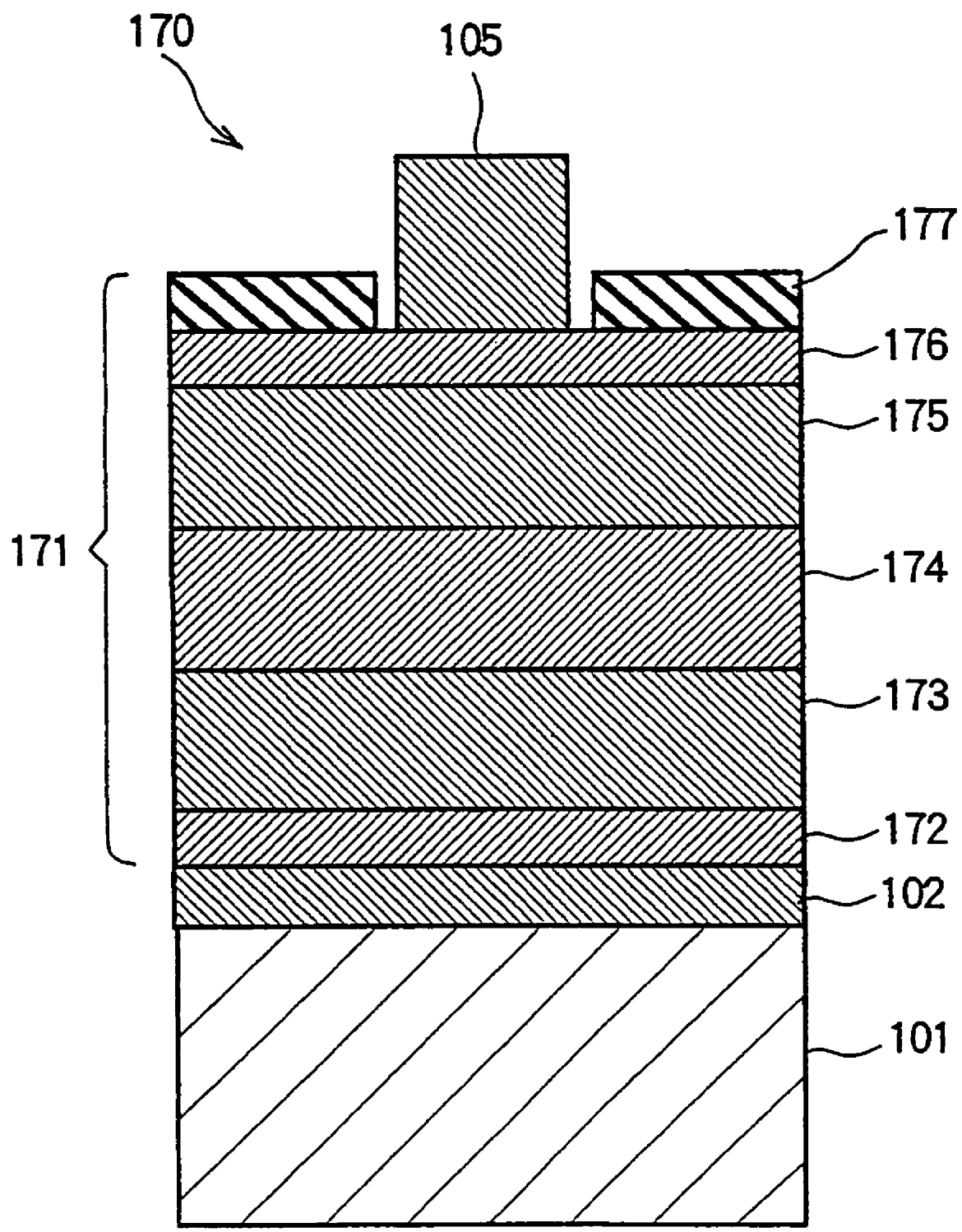
FIG. 17 is a cross sectional view schematically showing a cross section through line $S_{17}$-$S_{17}$ in FIG. 15.

A fourth embodiment of the invented semiconductor apparatus is shown schematically in partial plan view in FIG. 15, partial perspective view in FIG. 16, and partial cross sectional view in FIG. 17. In this integrated LED/driving-IC chip 170, each LED is formed as a separate LED epitaxial film 171.

Each LED epitaxial film 171 has the structure shown in FIG. 17, comprising a p-type GaAs lower contact layer 172, a p-type $Al_xGa_{1-x}As$ lower cladding layer 173, a p-type $Al_yGa_{1-y}As$ active layer 174, an n-type $Al_zGa_{1-z}As$ upper cladding layer 175, and an n-type GaAs upper contact layer 176. The Al composition ratios x, y, z may satisfy the conditions x>y and z>y (for example, x=z=0.4, y=0.1). A dielectric film 177 is formed on the n-type GaAs upper contact layer 176. A central stripe of the dielectric film 177 is removed to allow the individual interconnecting line 105 to make contact with the surface of the n-type GaAs upper contact layer 176 across the entire width of the LED epitaxial film 171 in the direction perpendicular to the drawing sheet in FIG. 17. The individual interconnecting line 105 extends to the terminal region 107a of the corresponding driving circuit 107, as shown in FIGS. 15 and 16.

The LED epitaxial film 171 is not limited to the sectional structure shown in FIG. 17 or the composition ratios described above. Various modifications are possible.

One effect of the fourth embodiment is that, since each LED epitaxial film 171 is extremely small, temperature-induced internal stress in the LED epitaxial film, which becomes significant if the thermal expansion coefficient of the LED epitaxial film differs greatly from that of the substrate 101, is greatly reduced, and one of the factors that can lead to LED failure is substantially eliminated. The reliability of the integrated LED/driving-IC chip 170 is enhanced accordingly.

The small size of the LED epitaxial films 171 also facilitates the process of bonding them to the metal layer 102, since the bonding area of each LED epitaxial film 171 is small. The rate of occurrence of incomplete contact defects is thus reduced.

A further effect is that, since the LED epitaxial films 171 do not include any parts other than the light-emitting region, the width of the LED epitaxial films can be reduced and the length of the individual interconnecting lines 105 can be correspondingly reduced.

Except for the foregoing points, the fourth embodiment is identical to the first embodiment.

Fifth Embodiment

Figure 18:
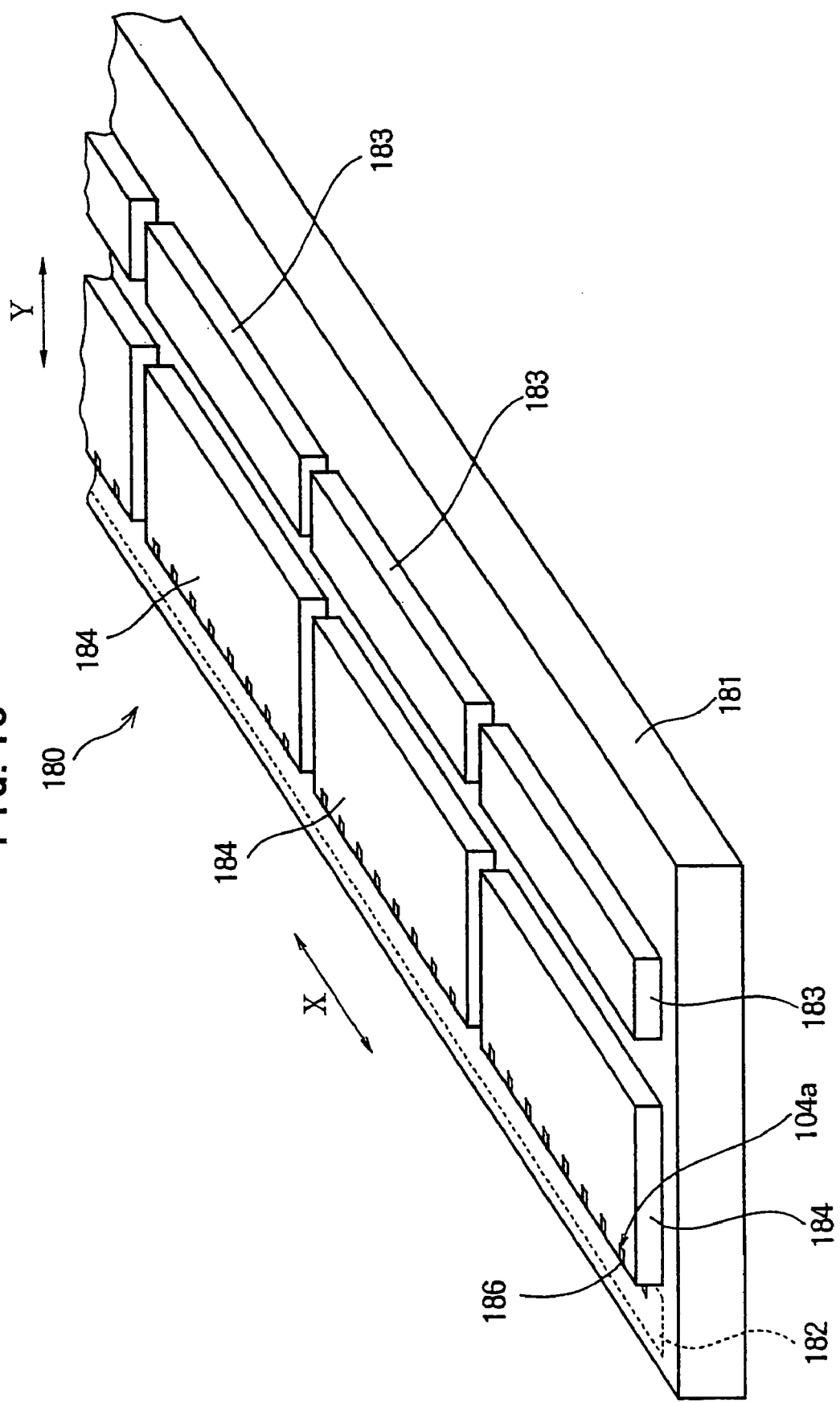
FIG. 18 is a perspective view schematically showing part of an integrated LED/driving-IC chip according to a fifth embodiment of the invention.
Figure 19:
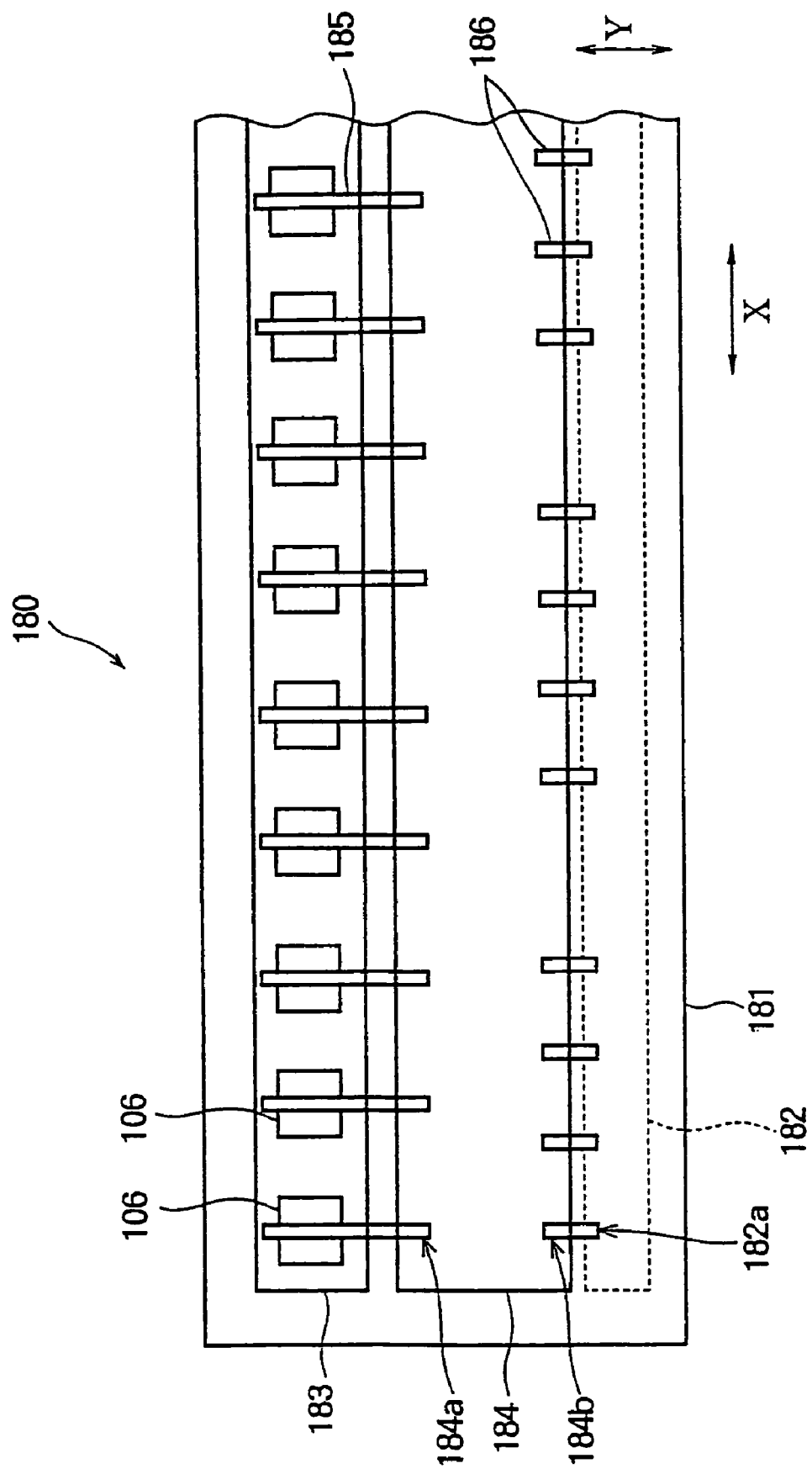
FIG. 19 is a plan view schematically showing part of the integrated LED/driving-IC chip in FIG. 18.

A fifth embodiment of the invented semiconductor apparatus is shown schematically in partial perspective view in FIG. 18 and partial plan view in FIG. 19. The integrated LED/driving-IC chip 180 in the fifth embodiment comprises: a substrate 181 on which a circuit pattern 182 with terminal areas 182a is formed; a plurality of LED epitaxial films 183 bonded to the surface of the substrate 181; a plurality of thin integrated circuit films 184 bonded to the surface of the substrate 181; and a plurality of thin-film individual interconnecting lines 185 and 186 (shown in FIG. 19). In the fifth embodiment, each thin integrated circuit film 184 faces one LED epitaxial film 183, as shown in FIG. 18, and has terminal areas 184a and 184b, as shown in FIG. 19.

The first thin-film individual interconnecting lines 185 extend from the LEDs 106 in the LED epitaxial films 183, over the surface of the substrate 181, to the thin integrated circuit films 184, electrically interconnecting the light-emitting parts of the LEDs 106 and the facing terminal areas 184a in the thin integrated circuit films 184. An interlayer dielectric layer (not shown) is provided below the first individual interconnecting lines 185 where necessary to avoid electrical short circuits.

The second thin-film individual interconnecting lines 186 extend from the thin integrated circuit films 184 to the circuit pattern 182 on the substrate 181, electrically interconnecting terminal areas 184b in the thin integrated circuit films 184 and the terminal areas 182a of the circuit pattern 182. These individual interconnecting lines 186 are used for, for example, input and output of electrical signals and power for the driving circuits in the thin integrated circuit films 184. An interlayer dielectric layer (not shown) is provided below the second individual interconnecting lines 186 where necessary to avoid electrical short circuits with the circuit pattern 182 and thin integrated circuit films 184.

Since the conventional bonding wires are replaced by thin-film individual interconnecting lines 185 and 186, a reduction in size and material can be achieved, and the rate of interconnection faults can be reduced. Compared with the first embodiment, the reduced size of the thin integrated circuit films 184 facilitates their attachment to the substrate.

Except for the foregoing points, the fifth embodiment is identical to the first embodiment.

Sixth Embodiment

Figure 20:
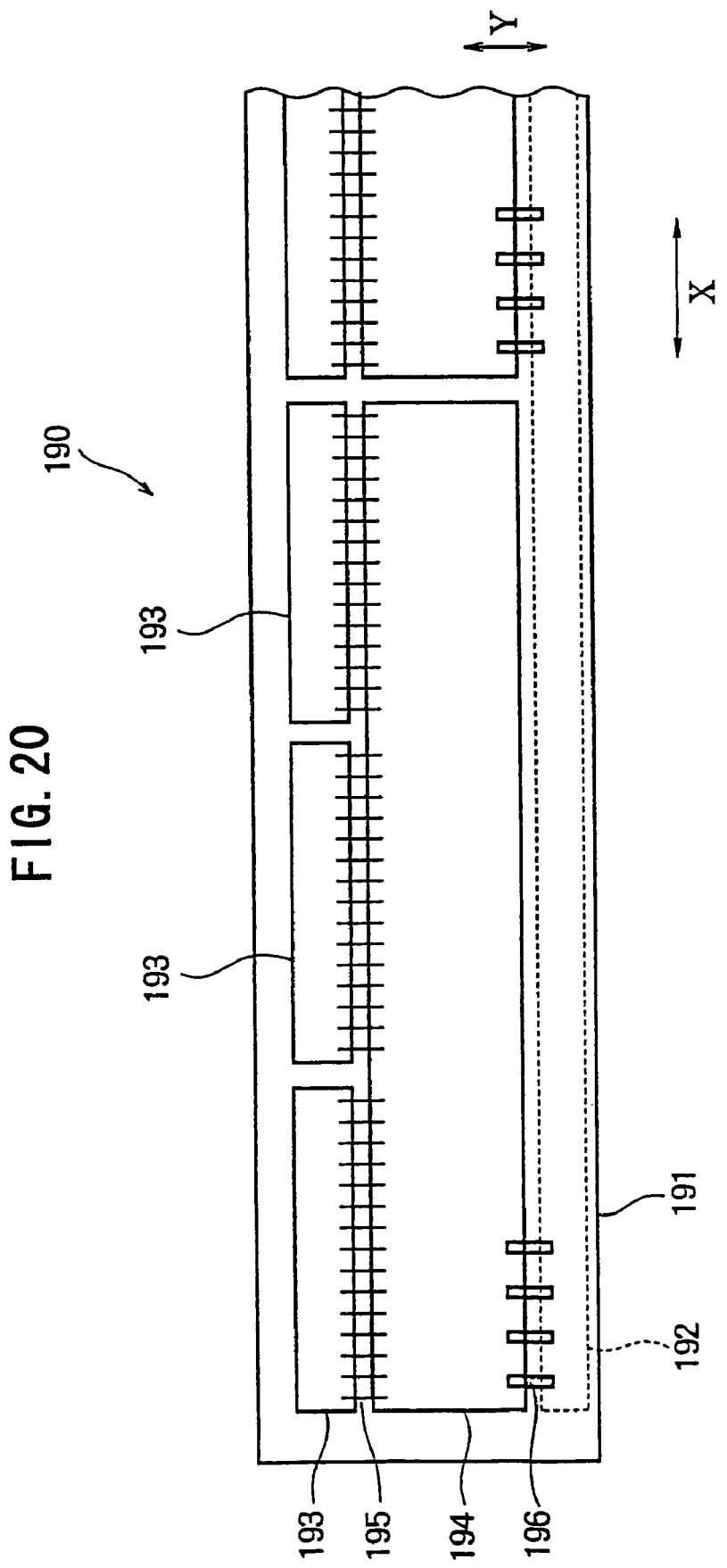
FIG. 20 is a plan view schematically showing part of an integrated LED/driving-IC chip according to a sixth embodiment of the invention.

A sixth embodiment of the invented semiconductor apparatus is shown schematically in partial plan view in FIG. 20. The integrated LED/driving-IC chip 190 according to the sixth embodiment comprises: a substrate 191 on which a circuit pattern 192 is formed; a plurality of LED epitaxial films 193 bonded to the surface of the substrate 191; a plurality of thin integrated circuit films 194 bonded to the surface of the substrate 191; and a plurality of thin-film individual interconnecting lines 195 and 196. The sixth embodiment differs from the fifth embodiment in that each thin integrated circuit film 194 faces three LED epitaxial films 193. The thin integrated circuit films 194 have terminal areas to which the first and second individual interconnecting lines 195 and 196 are connected. The circuit pattern 192 on the substrate 191 has terminal areas to which the second individual interconnecting lines 196 are connected.

The first thin-film individual interconnecting lines 195 extend from the LEDs in the LED epitaxial films 193, over the surface of the substrate 191, to the thin integrated circuit films 194, electrically interconnecting the light-emitting parts of the LEDs and the facing terminal areas in the thin integrated circuit films 194. An interlayer dielectric layer (not shown) is provided below the first individual interconnecting lines 195 where necessary to avoid electrical short circuits.

The second thin-film individual interconnecting lines 196 extend from the thin integrated circuit films 194 to the terminal areas of the circuit pattern 192 in the substrate 191, electrically interconnecting terminal areas in the thin integrated circuit films 194 with the terminal areas of the circuit pattern 192. The second individual interconnecting lines 196 are used for, for example, input and output of electrical signals and power for the driving circuits in the thin integrated circuit films 194. An interlayer dielectric layer (not shown) is provided below the second individual interconnecting lines 196 where necessary to avoid electrical short circuits with the circuit pattern 192 and thin integrated circuit films 194.

Compared with the fifth embodiment, the sixth embodiment requires fewer second individual interconnecting lines, since there are fewer thin integrated circuit films, and the circuit pattern on the substrate can be simplified accordingly.

In other respects, the sixth embodiment is substantially identical to the fifth embodiment. Since the conventional bonding wires are replaced by thin-film individual interconnecting lines 195 and 196, a reduction in size and material can be achieved, and the rate of interconnection faults can be reduced.

Seventh Embodiment

Figure 21:
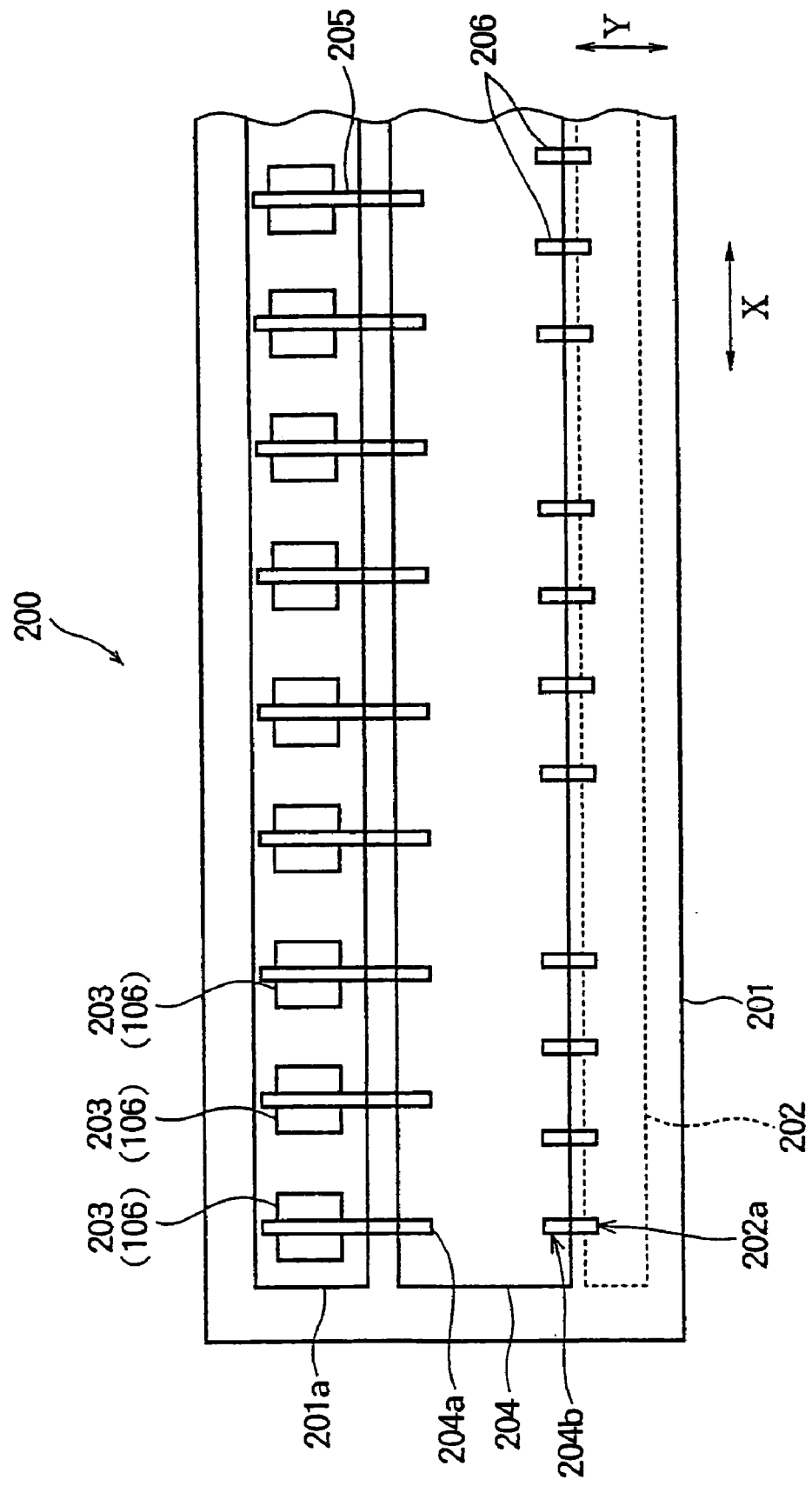
FIG. 21 is a plan view schematically showing part of an integrated LED/driving-IC chip according to a seventh embodiment.

A seventh embodiment of the invented semiconductor apparatus is shown schematically in partial plan view in FIG. 21. The integrated LED/driving-IC chip 200 according to the seventh embodiment comprises: a substrate 201 on which a circuit pattern 202 with terminal areas 202a is formed; a metal layer 201a formed on the substrate 201 in tight contact therewith; a plurality of LED epitaxial films 203 bonded to the surface of the metal layer 201a; a thin integrated circuit film 204 bonded to the surface of the substrate 201; and a plurality of thin-film individual interconnecting lines 205 and 206. The thin integrated circuit film 204 has terminal areas 204a and 204b. The integrated LED/driving-IC chip 200 according to the seventh embodiment differs from the integrated LED/driving-IC chip 180 shown in FIG. 18 (the fifth embodiment) in that each LED 106 is formed as a separate LED epitaxial film 203. The LED epitaxial films 203 are bonded onto the metal layer 201a in a single row at regular intervals.

The circuit pattern 202 is an interconnection pattern connecting input/output terminals for power and electrical signals on the substrate 201 with terminal areas 204b of the thin integrated circuit film 204, and with terminals of other circuit elements such as resistors, capacitors, and memory circuits, external to the thin integrated circuit film 204, which are provided on the substrate 201 for driving control. The circuit pattern 202 may also connect terminal areas 204b of the thin integrated circuit film 204 with the terminals of these resistors, capacitors, memory circuits, and other circuit elements.

The first individual interconnecting lines 205 extend from above the LEDs in the LED epitaxial film 203, over the surface of the substrate 201, to the thin integrated circuit film 204, electrically interconnecting the light-emitting parts of the LEDs and the facing terminal areas 204a in the thin integrated circuit film 204. An interlayer dielectric film (not shown) is provided below the individual interconnecting lines 205 where necessary to avoid electrical short circuits.

The second individual interconnecting lines 206 extend from the thin integrated circuit film 204 to the circuit pattern 202 on the substrate 201, electrically interconnecting terminal areas 204b in the thin integrated circuit film 204 and terminal areas 202a of the circuit pattern 202. The second individual interconnecting lines 206 are used for, for example, input and output of electrical signals and power for the driving circuits in the thin integrated circuit film 204. An interlayer dielectric layer (not shown) is provided below the individual interconnecting lines 206 where necessary to avoid electrical short circuits with the circuit pattern 202 or thin integrated circuit film 204.

Except for the foregoing points, the seventh embodiment is identical to the fifth embodiment described above. Since the conventional bonding wires are replaced by thin-film individual interconnecting lines 205 and 206, a reduction in size and material can be achieved, and the rate of interconnection faults can be reduced. In addition, the small size of the LED epitaxial films 203 facilitates their secure bonding to the metal layer 201a, enables the width of the LED epitaxial films to be reduced, and reduces the LED failure rate by reducing thermal stress.

Eighth Embodiment

Figure 22:
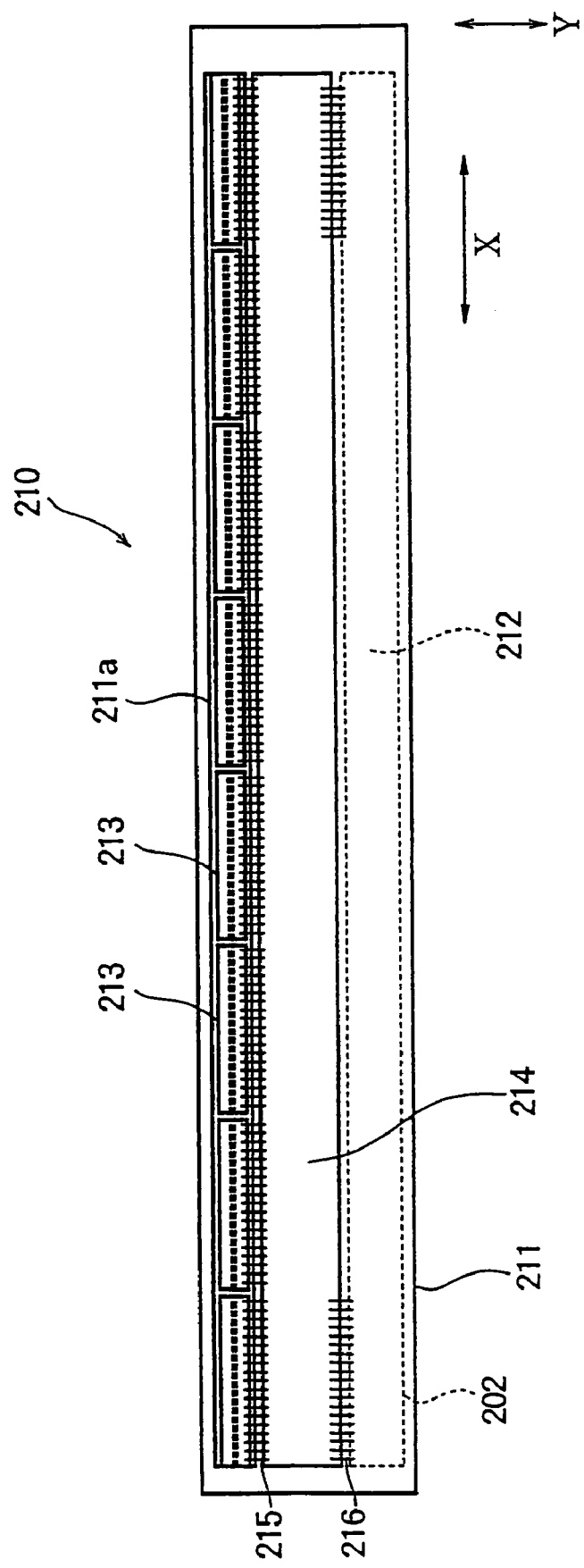
FIG. 22 is a plan view schematically showing part an integrated LED/driving-IC chip according to an eighth embodiment.
Figure 23:
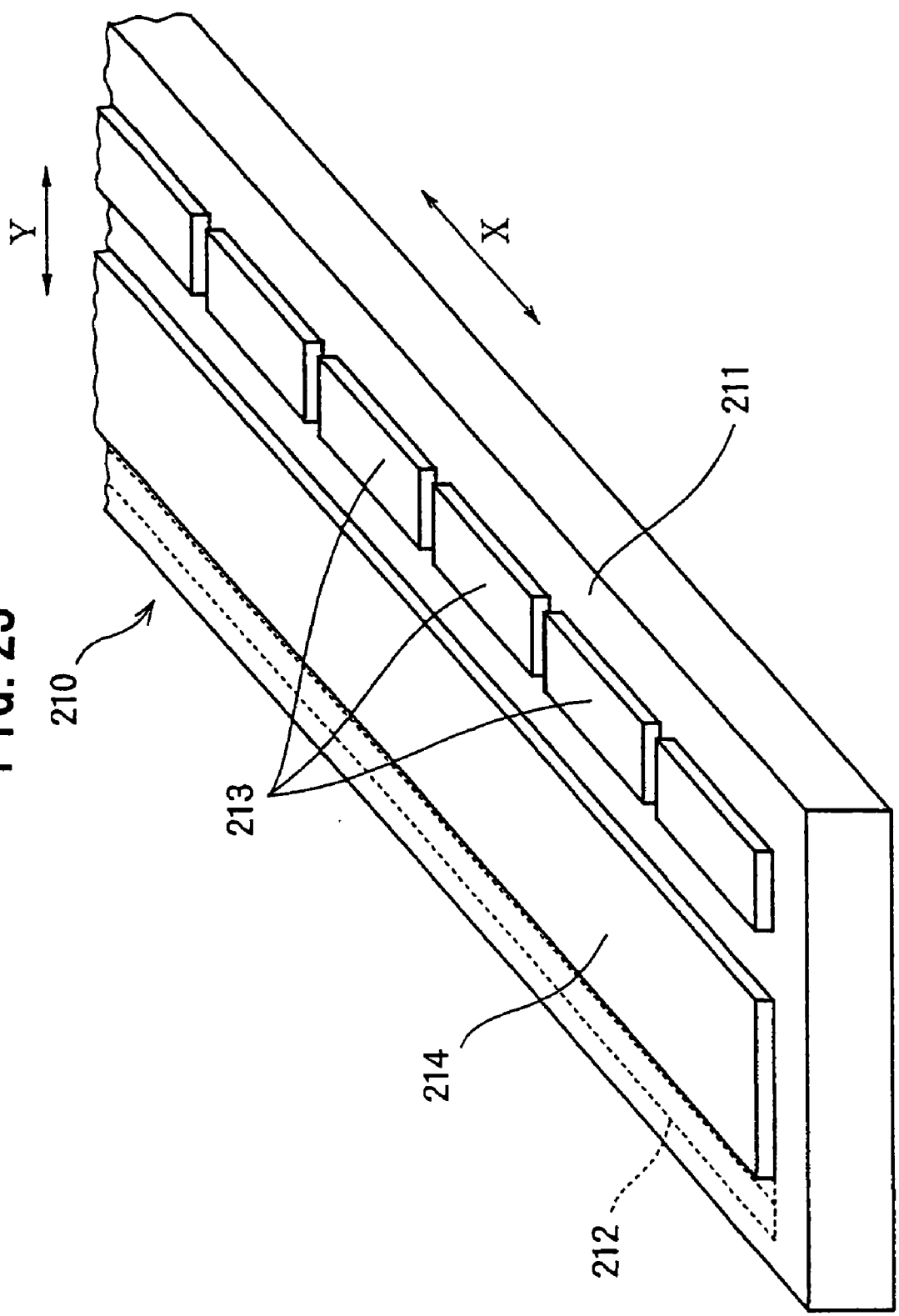
FIG. 23 is a perspective view schematically showing part of the integrated LED/driving-IC chip in FIG. 22.

An eighth embodiment of the invented semiconductor apparatus is shown schematically in plan view in FIG. 22 and in partial perspective view in FIG. 23. The integrated LED/driving-IC chip 210 in the eighth embodiment comprises: a substrate 211 on which a circuit pattern 212 is formed; a metal layer 211a formed on the substrate 211 in tight contact therewith; a plurality of LED epitaxial films 213 bonded to the surface of the metal layer 211a; a thin integrated circuit film 214 bonded to the surface of the substrate 211; and a plurality of thin-film individual interconnecting lines 215 and 216. The LED epitaxial films 213 are bonded onto the metal layer 211a in a single row. Terminal areas for the individual interconnecting lines 215 and 216 are provided in the thin integrated circuit film 214, and terminal areas for the second individual interconnecting lines 216 are provided in the circuit pattern 212 on the substrate 211.

The first thin-film individual interconnecting lines 215 extend from above the LEDs in the LED epitaxial films 213, over the surface of the substrate 211, to the thin integrated circuit film 214, electrically interconnecting the light-emitting parts of the LEDs and the facing terminal areas in the thin integrated circuit film 214. An interlayer dielectric film (not shown) is provided below the individual interconnecting lines 215 where necessary to avoid electrical short circuits.

The second thin-film individual interconnecting lines 216 extend from the thin integrated circuit film 214 to the circuit pattern 212 on the substrate 211, electrically interconnecting terminal areas in the thin integrated circuit film 214 and terminal areas of the circuit pattern 212. The second individual interconnecting lines 216 are used for, for example, input and output of electrical signals and power for the driving circuits in the thin integrated circuit film 214. An interlayer dielectric layer (not shown) is provided below the individual interconnecting lines 216 where necessary to avoid electrical short circuits with the circuit pattern 212 and thin integrated circuit film 214.

Since the conventional bonding wires are replaced by thin-film individual interconnecting lines 215 and 216, a reduction in size and material can be achieved, and the rate of interconnection faults can be reduced.

Figure 24:
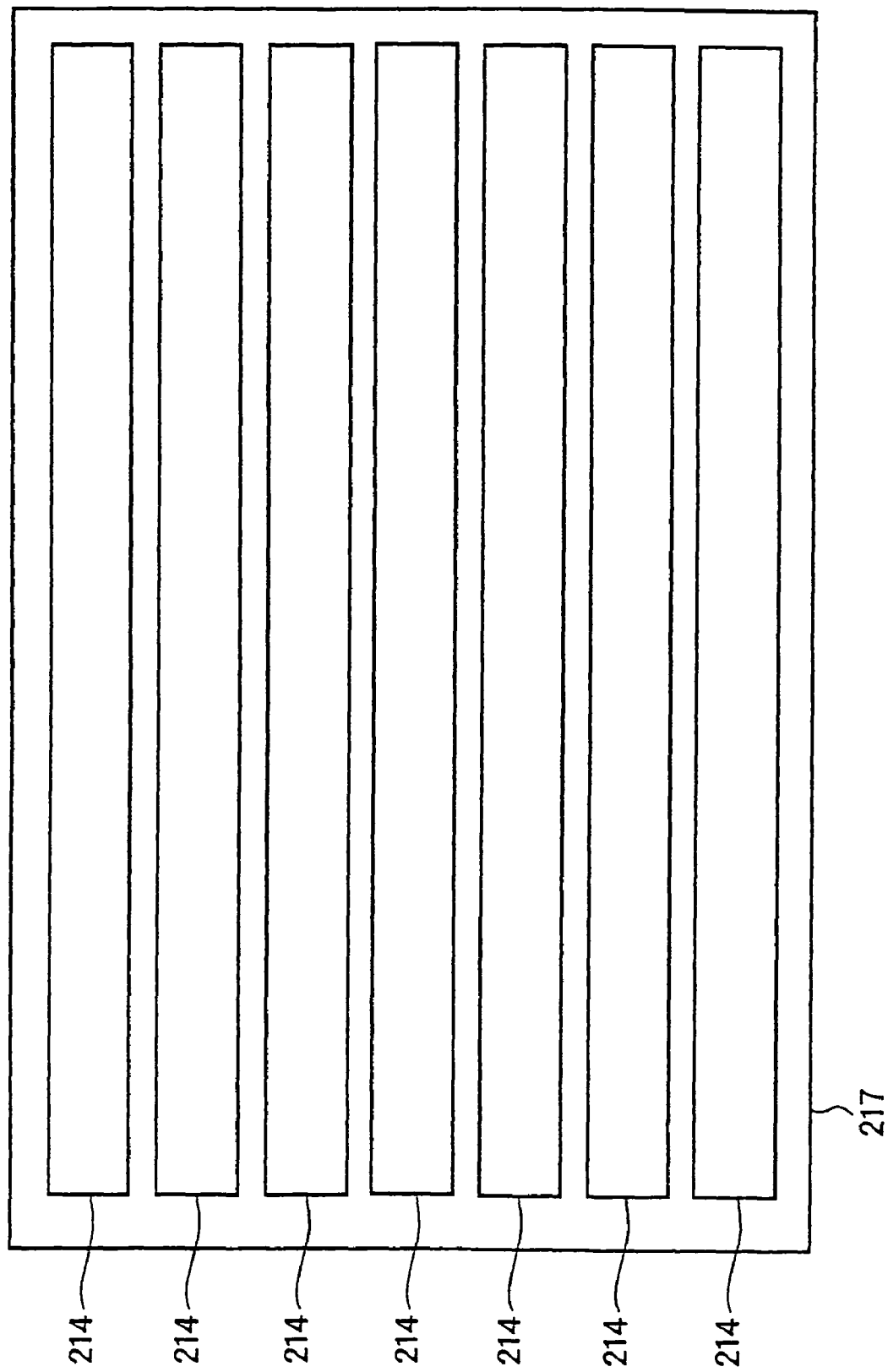
FIG. 24 is a plan view illustrating the fabrication of the thin integrated circuit film in the eighth embodiment.

A fabrication process for the thin integrated circuit film 214 in the eighth embodiment is illustrated schematically in FIG. 24. A plurality of thin integrated circuit films 214 are formed together on a fabrication substrate 217 such as, for example, a glass substrate. Each thin integrated circuit film 214 is detached from the glass substrate 217, and then bonded to the substrate 211 of an integrated LED/driving-IC chip 210. The fabrication process includes heat treatment steps, but since these steps are carried out on the glass substrate 217, the substrate 211 of the integrated LED/driving-IC chip 210 need not be highly heat resistant, which widens the choice of substrate materials.

Except for the foregoing points, the eighth embodiment is similar to the first embodiment.

Ninth Embodiment

Figure 25:
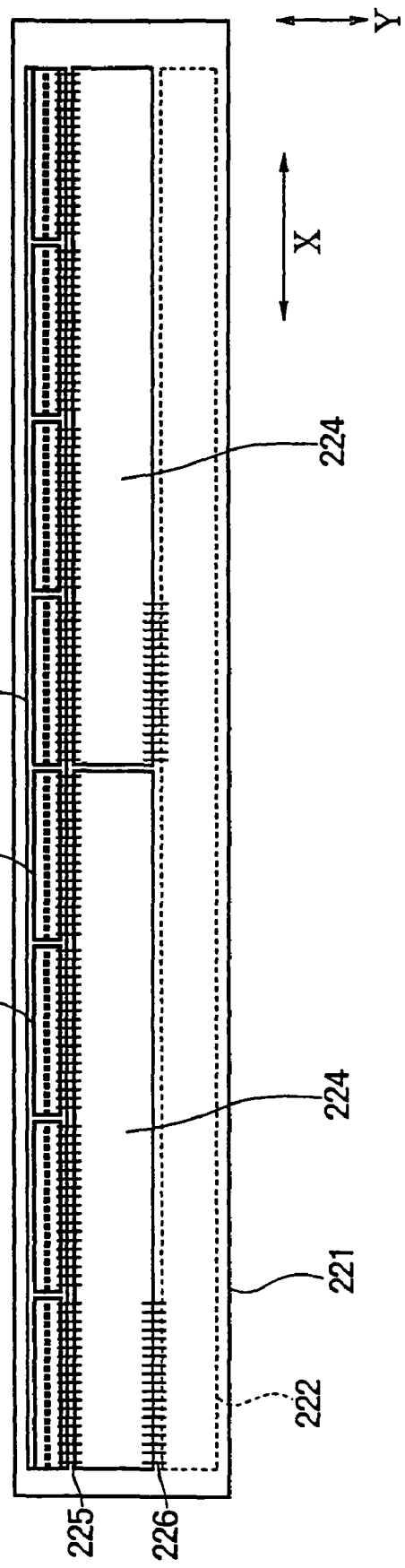
FIG. 25 is a plan view schematically showing an integrated LED/driving-IC chip according to a ninth embodiment of the invention.

A ninth embodiment of the invented semiconductor apparatus is shown schematically in plan view in FIG. 25. The integrated LED/driving-IC chip 220 according to the ninth embodiment comprises: a substrate 221 on which a circuit pattern 222 is formed; a metal layer 221a formed on the substrate 221 in tight contact therewith; a plurality of LED epitaxial films 223 bonded to the surface of the metal layer 221a; a pair of thin integrated circuit films 224 bonded to the surface of the substrate 221; and a plurality of thin-film individual interconnecting lines 225 and 226. The LED epitaxial films 223 are bonded onto the metal layer 221a in a single row. The thin integrated circuit films 224 have terminal areas for the first and second individual interconnecting lines 225 and 226, and the circuit pattern 222 on the substrate 221 has terminal areas for the second individual interconnecting lines 226.

The number of LED epitaxial films 223 is not limited to the eight shown in the drawings, and the number of thin integrated circuit films 224 is not limited to two. For example, there may be three or more thin integrated circuit films 224.

The first thin-film individual interconnecting lines 225 extend from the LED epitaxial films 223 over the surface of the substrate 221 to the thin integrated circuit films 224, electrically interconnecting the light-emitting parts of the LEDs in the LED epitaxial films 223 with terminal areas in the thin integrated circuit film 224. An interlayer dielectric film (not shown) is provided below the individual interconnecting lines 225 where necessary to avoid electrical short circuits.

The second thin-film individual interconnecting lines 226 extend from the thin integrated circuit films 224 to the circuit pattern 222 on the substrate 221, electrically interconnecting terminal areas in the thin integrated circuit films 224 with terminal areas of the circuit pattern 222. The second individual interconnecting lines 226 are used for, for example, input and output of electrical signals and power for the driving circuits in the thin integrated circuit films 224. An interlayer dielectric film (not shown) is provided below the individual interconnecting lines 226 where necessary to avoid electrical short circuits with the circuit pattern 222 and thin integrated circuit films 224.

Except for the division of the thin integrated circuit film into multiple parts, the ninth embodiment is similar to the eighth embodiment. Since the conventional bonding wires are replaced by thin-film individual interconnecting lines 225 and 226, a reduction in size and material can be achieved, and the rate of interconnection faults can be reduced. The division of the thin integrated circuit film into multiple parts facilitates the handling and attachment thereof.

LED Print Head

Figure 26:
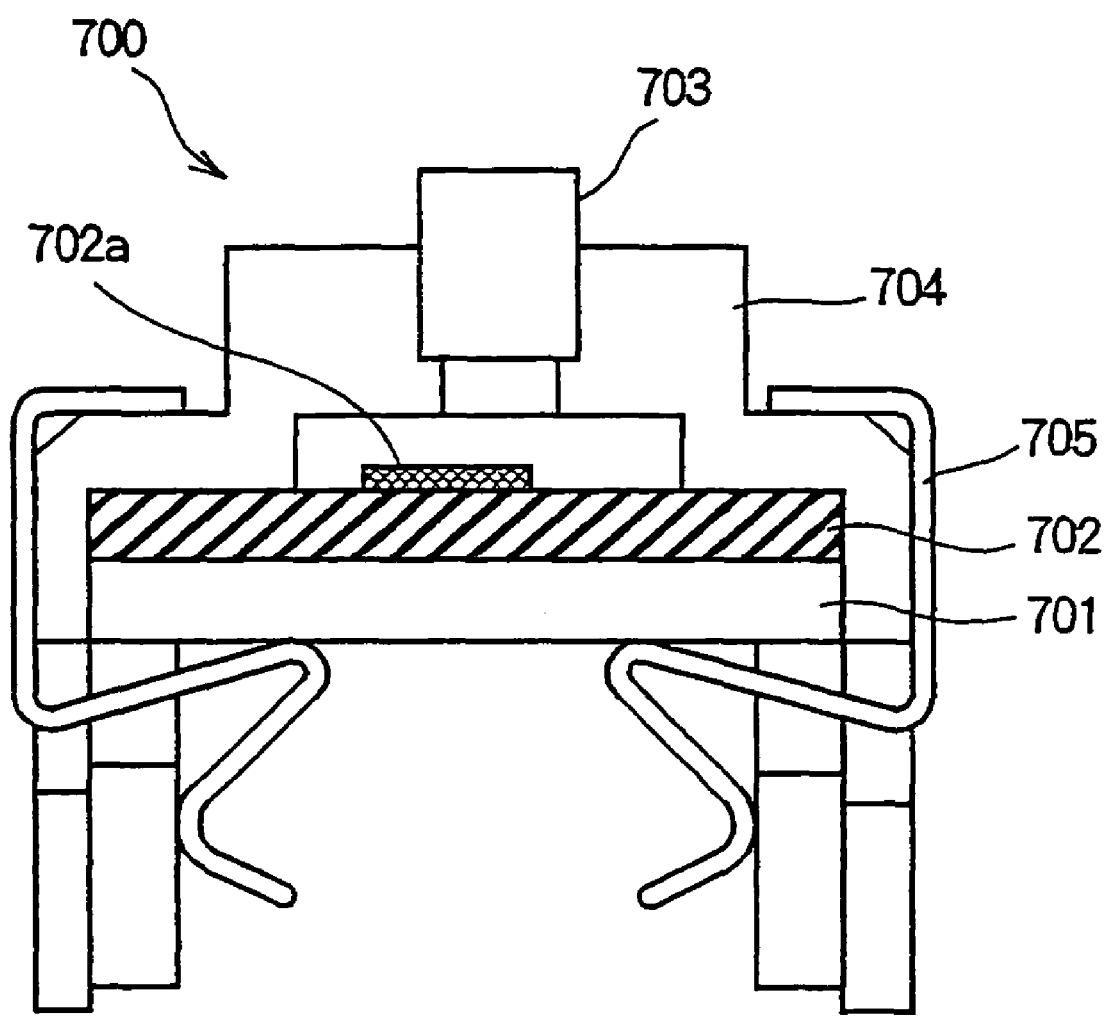
FIG. 26 is a cross sectional view schematically showing an LED print head employing the invented semiconductor apparatus.

FIG. 26 shows an example of an LED print head 700 employing the present invention. The LED print head 700 includes a base 701 on which an LED unit 702 is mounted. The LED unit 702 includes a plurality of integrated LED/driving-IC chips 702a of the type described in any of the preceding embodiments, mounted so that their light-emitting parts are positioned beneath a rod lens array 703. The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

Use of integrated LED/driving-IC chips 702a instead of the conventional paired LED array chips and driver IC chips enables the LED unit 702 to be reduced in size and reduces its assembly cost, as there are fewer chips to be mounted.

LED Printer

Figure 27:
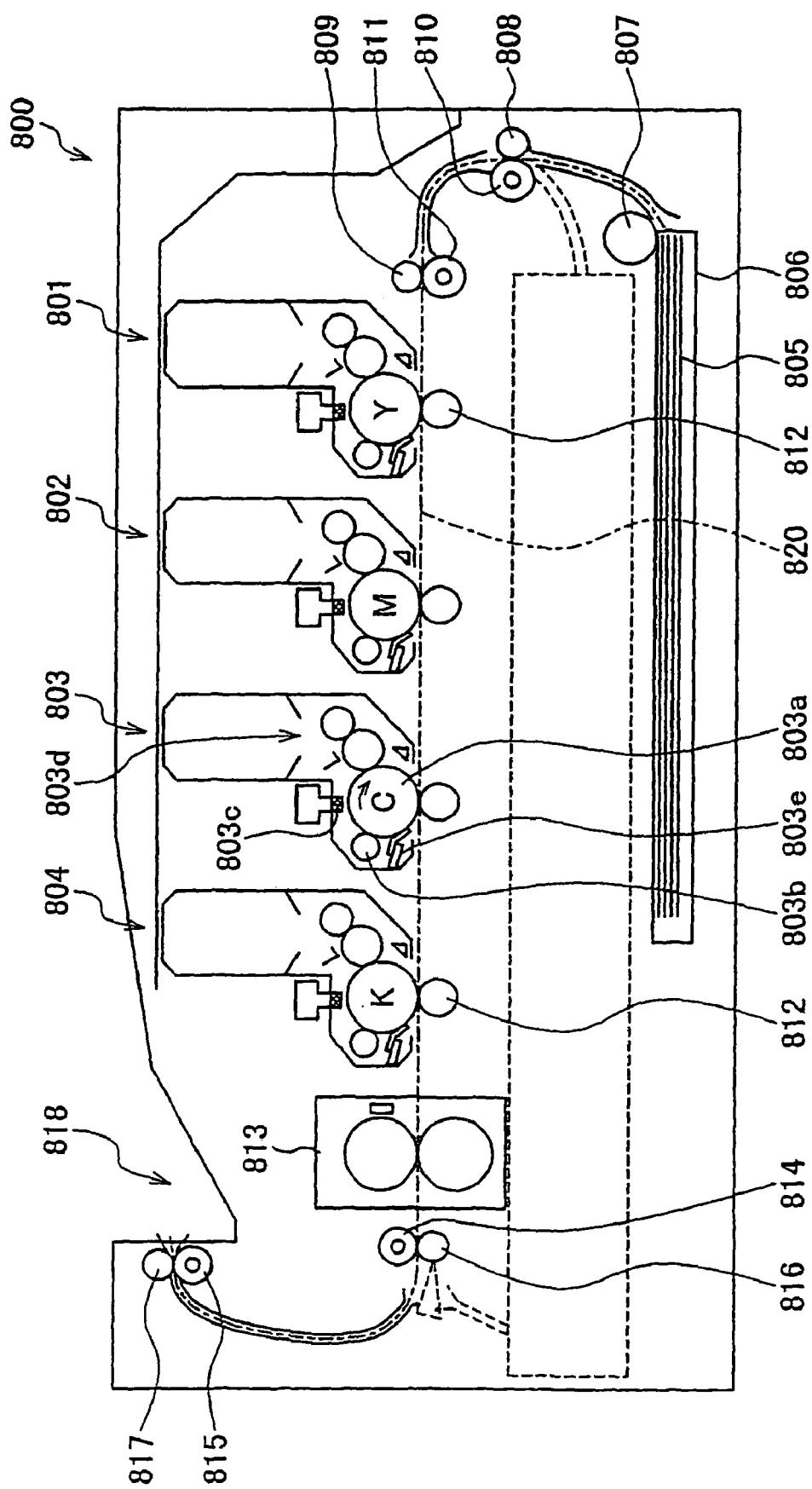
FIG. 27 is a schematic cutaway side view of an LED printer employing the invented semiconductor apparatus.
Figure 28:
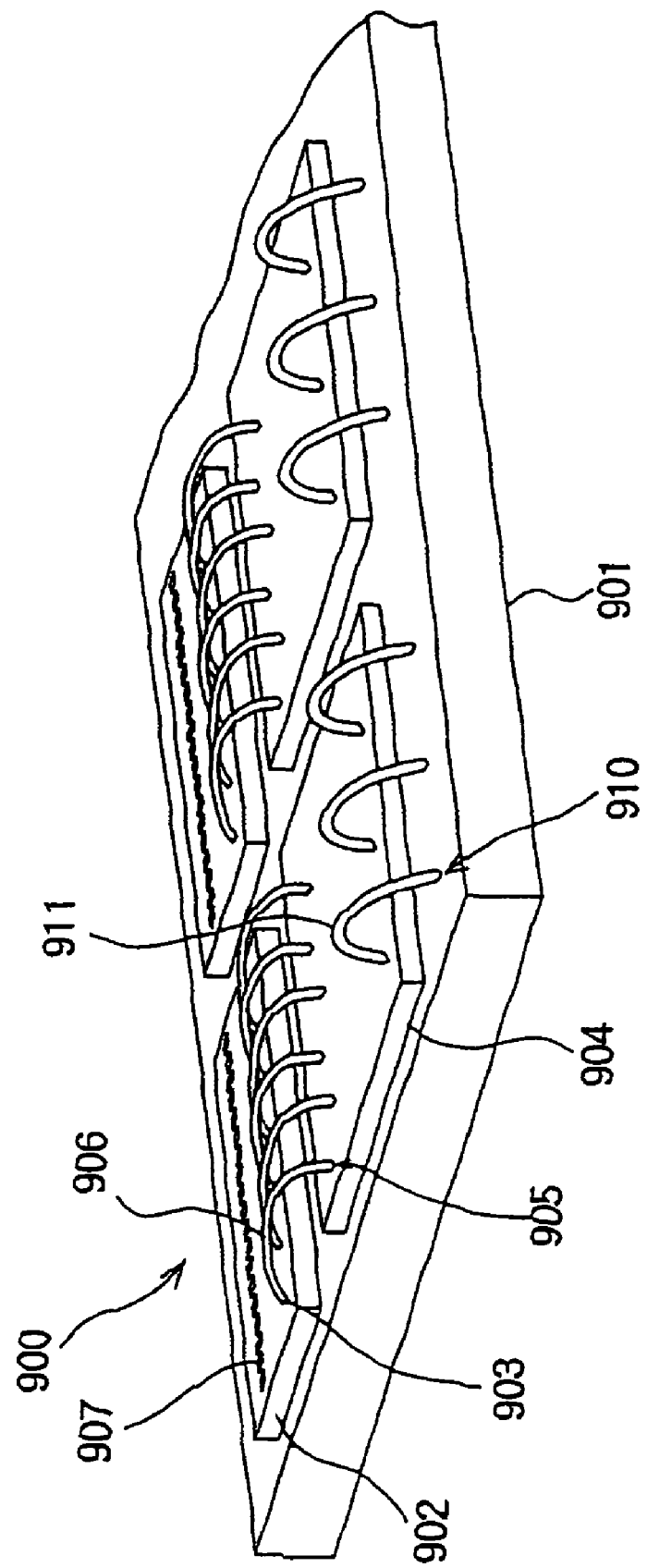
FIG. 28 is a perspective view schematically showing part of a conventional LED print head.
Figure 29:
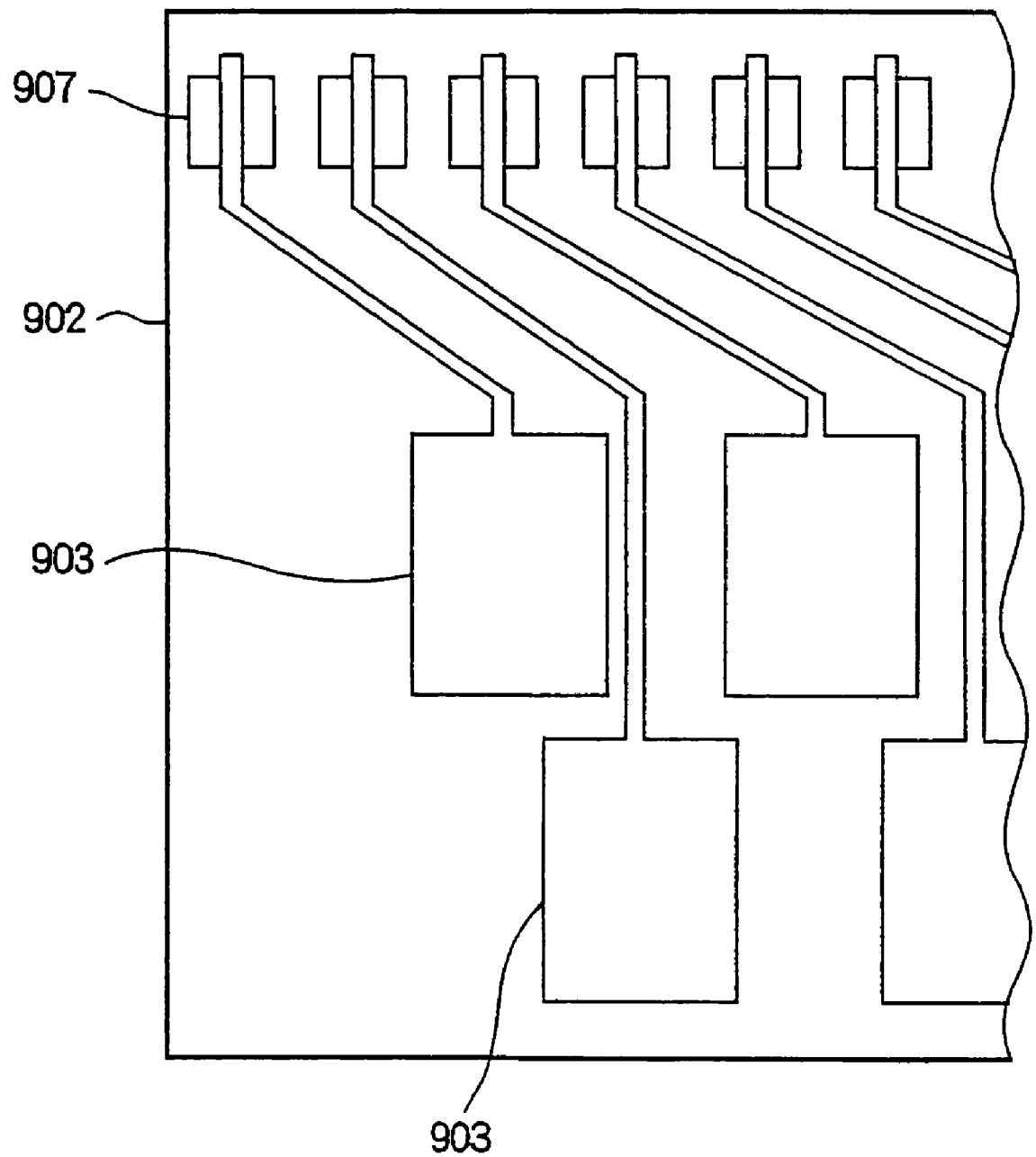
FIG. 29 is a plan view schematically showing part of an LED array chip in the conventional LED print head.

FIG. 27 shows an example of a full-color LED printer 800 in which the present invention may be employed. The printer 800 has a yellow (Y) process unit 801, a magenta (M) process unit 802, a cyan (C) process unit 803, and a black (K) process unit 804, which are mounted following one another in tandem fashion. The cyan process unit 803, for example, includes a photosensitive drum 803a that turns in the direction indicated by the arrow, a charging unit 803b that supplies current to the photosensitive drum 803a to charge the surface thereof, an LED print head 803c that selectively illuminates the charged surface of the photosensitive drum 803a to form an electrostatic latent image, a developing unit 803d that supplies cyan toner particles to the surface of the photosensitive drum 803a to develop the electrostatic latent image, and a cleaning unit 803e that removes remaining toner from the photosensitive drum 803a after the developed image has been transferred to paper. The LED print head 803c has, for example, the structure shown in FIG. 26, including integrated LED/driving-IC chips 702a of the type described in any of the nine embodiments above. The other process units 801, 802, 804 are similar in structure to the cyan process unit 803, but use different toner colors.

The paper 805 (or other media) is held as a stack of sheets in a cassette 806. A hopping roller 807 feeds the paper 805 one sheet at a time toward a paired transport roller 810 and pinch roller 808. After passing between these rollers, the paper 805 travels to a registration roller 811 and pinch roller 809, which feed the paper toward the yellow process unit 801.

The paper 810 passes through the process units 801, 802, 803, 804 in turn, traveling in each process unit between the photosensitive drum and a transfer roller 812 made of, for example, semi-conductive rubber. The transfer roller 812 is charged so as to create a potential difference between it and the photosensitive drum. The potential difference attracts the toner image from the photosensitive drum onto the paper 805. A full-color image is built up on the paper 805 in four stages, the yellow process unit 801 printing a yellow image, the magenta process unit 802 a magenta image, the cyan process unit 803 a cyan image, and the black process unit 804 a black image.

From the black process unit 804, the paper 805 travels through a fuser 813, in which a heat roller and back-up roller apply heat and pressure to fuse the transferred toner image onto the paper. A first delivery roller 814 and pinch roller 816 then feed the paper 805 upward to a second delivery roller 815 and pinch roller 817, which deliver the printed paper onto a stacker 818 at the top of the printer.

The photosensitive drums and various of the rollers are driven by motors and gears not shown in the drawing. The motors are controlled by a control unit (not shown) that, for example, drives the transport roller 810 and halts the registration roller 811 until the front edge of a sheet of paper 805 rests flush against registration roller 811, then drives the registration roller 811, thereby assuring that the paper 805 is correctly aligned during its travel through the process units 801, 802, 803, 804. The transport roller 810, registration roller 811, delivery rollers 814, 815, and pinch rollers 808, 809, 816, 817 also have the function of changing the direction of travel of the paper 805.

The LED heads account for a significant part of the manufacturing cost of this type of LED printer 800. By using highly reliable and space-efficient integrated LED/driving-IC chips and enabling these chips and the LED units in the LED heads to be manufactured by a simplified fabrication process with reduced material costs, the present invention enables a high-quality printer to be produced at a comparatively low cost.

Similar advantages are obtainable if the invention is applied to a full-color copier. The invention can also be advantageously used in a monochrome printer or copier or a multiple-color printer or copier, but its effect is particularly great in a full-color image-forming apparatus (printer or copier), because of the large number of exposure devices (print heads) required in such apparatus.

The invention is not limited to the preceding embodiments. For example, the metal layer 102 used in several of the embodiments can be replaced by a thin film of polysilicon or any other suitable material.

The metal layer 102 has been drawn as a rectangle with straight edges and square corners, but the rectangular shape can be modified to include, for example, a cut-off corner and a side meander. The cut-off corner can be used as a reference for determining the orientation of the chip. The meander can be used as a reference for determining the positions of the LEDs.

The LED epitaxial films may be replaced with a thin semiconductor film in which semiconductor devices other than LEDs are formed. Possible examples of these other semiconductor devices include semiconductor lasers, photodetectors, Hall elements, and piezoelectric devices.

The LED epitaxial films need not be grown as an epitaxial layer on a fabrication substrate. Any available fabrication method may be used.

The LED epitaxial films need not be mounted adjacent to the thin integrated circuit film on the substrate; it may be separated from the thin integrated circuit film by an arbitrary distance, provided voltage drop in the interconnecting lines does not become a problem.

The thin integrated circuit film has been described as being fabricated on an SOI substrate, but other fabrication methods can be used. For example, the thin integrated circuit film may be a polysilicon film with thin-film transistors (TFTs). To fabricate this type of film, a thin amorphous silicon film may be formed by a method such as chemical vapor deposition (CVD), with a relatively low deposition temperature, on a glass substrate on which an $SiO_2$ layer several hundred nanometers thick has been formed. The amorphous silicon is then recrystallized by, for example, illumination by an excimer pulse laser to obtain a polycrystalline silicon layer. Integrated circuit patterns including circuit elements such as transistors are formed in the polycrystalline silicon layer.

The common electrode formed on the underside of the LED epitaxial films may be divided into multiple electrodes, to drive different groups of LEDs at different timings.

Those skilled in the art will recognize that further variations are possible within the scope of invention, which is defined by the appended claims.

What is claimed is:

1. A method fabricating a semiconductor apparatus, comprising the steps of:
    providing an SOI substrate that includes a silicon substrate, a silicon film, and a buried $SiO_2$ layer that is disposed between the silicon substrate and the silicon film;
    fabricating a row of driver circuits on the silicon film, the row of driver circuits having a predetermined length;

detaching the silicon film from the silicon substrate by etching the SiO$_2$ layer from between the silicon substrate and the silicon film after the row of driver circuits has been fabricated on the silicon film; and removing the silicon film, including the row of driver circuits, from the silicon substrate;

mounting the silicon film, including the row of driver circuits, on another substrate, the another substrate being made of a material consisting of glass, resin, and ceramic;

mounting a row of LED units on the another substrate adjacent the row of driver circuits and substantially parallel to the row of driver circuits, each LED unit having a plurality of LEDs, each LED unit having a length that is substantially shorter than the length of the row of driver elements; and electrically connecting each LED to a respective one of the driver elements.

* * * * *